(12) United States Patent
Chou et al.

(10) Patent No.: US 6,821,833 B1
(45) Date of Patent: Nov. 23, 2004

(54) METHOD FOR SEPARATELY OPTIMIZING THIN GATE DIELECTRIC OF PMOS AND NMOS TRANSISTORS WITHIN THE SAME SEMICONDUCTOR CHIP AND DEVICE MANUFACTURED THEREBY

(75) Inventors: Anthony I-Chih Chou, Fishkill, NY (US); Toshiharu Furukawa, Essex Junction, VT (US); Patrick R. Varekamp, Croton on Hudson, NY (US); Jeffrey W. Sleight, Ridgefield, CT (US); Akihisa Sekiguchi, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,110

(22) Filed: Sep. 9, 2003

(51) Int. Cl.[7] .......................................... H01L 21/8238
(52) U.S. Cl. ...................... 438/199; 438/775; 438/769; 257/369; 257/410; 257/405; 257/411
(58) Field of Search ................................ 438/199, 775, 438/769, 778, 766, 770, 197, 287, 591, 792; 257/365, 410, 405, 411

(56) References Cited

U.S. PATENT DOCUMENTS

| | | | |
|---|---|---|---|
| 5,596,218 A | * | 1/1997 | Soleimani et al. .......... 257/369 |
| 5,880,040 A | * | 3/1999 | Sun et al. ................... 438/769 |
| 6,093,661 A | | 7/2000 | Trivedi et al. |
| 6,110,842 A | * | 8/2000 | Okuno et al. ............... 438/776 |
| 6,300,664 B1 | * | 10/2001 | Kuroi et al. ................ 257/410 |
| 6,417,546 B2 | | 7/2002 | Trivedi et al. |
| 6,451,662 B1 | | 9/2002 | Chudzik et al. |
| 6,541,395 B1 | | 4/2003 | Trivedi et al. |
| 6,649,538 B1 | * | 11/2003 | Cheng et al. ............... 438/775 |
| 2002/0130377 A1 | | 9/2002 | Khare et al. |
| 2003/0027392 A1 | | 2/2003 | Gousev et al. |
| 2003/0082884 A1 | | 5/2003 | Faltermeier et al. |
| 2003/0100155 A1 | | 5/2003 | Lim et al. |

* cited by examiner

Primary Examiner—Olik Chaudhuri
Assistant Examiner—Belur V Keshavan
(74) Attorney, Agent, or Firm—Graham Jones; H. Daniel Schnurmann

(57) ABSTRACT

A method of forming CMOS semiconductor materials with PFET and NFET areas formed on a semiconductor substrate, covered respectively with a PFET and NFET gate dielectric layers composed of silicon oxide and different degrees of nitridation thereof. Provide a silicon substrate with a PFET area and an NFET area and form PFET and NFET gate oxide layers thereover. Provide nitridation of the PFET gate oxide layer above the PFET area to form the PFET gate dielectric layer above the PFET area with a first concentration level of nitrogen atoms in the PFET gate dielectric layer above the PFET area. Provide nitridation of the NFET gate oxide layer to form the NFET gate dielectric layer above the NFET area with a different concentration level of nitrogen atoms from the first concentration level. The NFET gate dielectric layer and the PFET gate dielectric layer can have the same thickness.

18 Claims, 17 Drawing Sheets

| | NITROGEN CONCENTRATION | | GATE LEAKAGE | | MOBILITY | | PERFORMANCE |
|---|---|---|---|---|---|---|---|
| | PFET oxynitride Nitrogen dose (cm$^{-2}$) | NFET oxynitride Nitrogen dose (cm$^{-2}$) | PFET gate leakage | NFET gate leakage | PFET mobility | NFET mobility | CMOS performance metric (NFET+PFET) |
| A | 0E15 | 0E15 | - | - | o | o | o |
| B | 1E15 | 1E15 | o | o | o | o | o |
| C | 2E15 | 2E15 | + | + | + | - | o |
| D | 2E15 | 1E15 | + | o | + | o | + |

Key: - = poor; o = acceptable; + = improved;

FIG. 11

METHOD FOR SEPARATELY OPTIMIZING THIN GATE DIELECTRIC OF PMOS AND NMOS TRANSISTORS WITHIN THE SAME SEMICONDUCTOR CHIP AND DEVICE MANUFACTURED THEREBY

BACKGROUND OF INVENTION

This invention relates to the process of manufacture of MOSFET devices and more particularly to the method for manufacture of thin gate dielectric layers for high-performance MOSFET devices.

The scaling of gate dielectric layers to smaller thicknesses is one of the key elements that enables the continued scaling of silicon CMOS technology to higher performance levels. Thinner gate dielectric layers generate more inversion charge, which increases transistor drive current, and also improves short-channel effects by increasing gate control of the channel. Because the gate dielectric layer is formed at the interface where the inversion layer is formed and transistor current is conducted, this must be an extremely high quality interface.

Oxynitrides (SiOxNy) are now widely used in the semiconductor industry as gate dielectric films. The desired properties of gate dielectrics are low gate leakage current, high dielectric constant to increase capacitance, high mobility, high reliability and good diffusion barrier properties. Pure $SiO_2$ has been the gate dielectric of choice since the early days of the integrated circuit, however, in recent years as gate dielectrics are being scaled into the sub 20 Å thickness range, oxynitrides have been increasingly used in high performance CMOS processes.

Silicon Oxynitrides (SiOxNy) are generated by two general techniques, thermal and plasma nitridation. Thermal nitridation of oxynitrides is carried out by high temperature exposure (650° C.–1000° C.) of a silicon surface, or silicon dioxide ($SiO_2$) surface to a reactive nitrogen containing gas such as nitrous oxide ($N_2O$), ammonia ($NH_3$), or nitrogen oxide (NO). Thermal energy is used to drive the nitridation reaction. Plasma nitridation of oxynitrides is performed by exposure of a silicon or $SiO_2$ surface to an activated nitrogen containing plasma. Because the nitrogen has been activated by the plasma, it can react to be incorporated in the oxynitride at lower temperatures than thermal nitridation (anywhere from room temperature to 800° C.). If the plasma nitridation process is performed at a low temperature (e.g. <100° C.), it can be compatible with a photoresist soft-mask process. In this type of low temperature process, the photoresist can be used to selectively block the nitridation from the covered areas, while the exposed areas receive the desired nitrogen incorporation. Thermal processes, as well as high temperature plasma process are not compatible with photoresist. Thermal processes require hard-masks that can withstand high temperatures. Photoresist soft-masking is particularly attractive because resist can be stripped using chemistries that are compatible with gate oxides (e.g. sulphuric acid/hydrogen peroxide ($H_2O_2$) mixtures).

Properly optimized oxynitrides have increased dielectric constants, lower gate leakage current, and improved diffusion barrier properties as compared to pure $SiO_2$. FIG. 1 shows how the gate leakage current decreases with increasing the duration of processing when using a Remote Plasma Nitridation (RPN) process of forming oxynitrides. Often these improvements must be carefully balanced against changes in mobility that may affect the transistor device current. Moreover, this optimization may be different for NFET and PFET devices which reside on the same semiconductor chip. In FIG. 1, gate leakage in (amperes/cm$^{-2}$) at 1.2 Volts is shown as a function of $T_{inv}$(Å). The parameter $T_{inv}$ is inversion thickness, which is a measure of the effective oxide thickness when the transistor is measured in inversion mode. Units are thickness such as angstroms (Å) or nanometers (nm).

FIGS. 2–3 show examples of how plasma nitridation affects the PFET and NFET device drive current differently. These examples demonstrate that the optimum nitrogen concentration in the gate dielectric is different between the NFET and PFET device, which is generally not known. The vertical axis is Joff and the horizontal axis is Jodlin where Jodlin stands for transistor drain current density (Amperes/ μm), i.e. per unit width of the transistor between the source and the drain. It is a transistor current measured with Vg (gate voltage) a fixed amount above Vt (threshold voltage) to help normalize out any threshold voltage differences. The Joff is a measure of off-state leakage per unit width of the transistor (between the source and the drain) with 0 Volts applied to the gate electrode.

FIGS. 4A–4D are schematic conceptual diagrams wherein FIGS. 4A–4D are views of NFET area 14 and related features taken along section line A–A" in FIG. 8A and PFET area 16 and related features taken along section line B–B" in FIG. 8A. FIGS. 4A–4D show juxtaposed PFET and NFET sectors of a semiconductor device 10 formed in a silicon substrate 12 in four steps of a prior art process, which illustrates how a standard sequence of processing steps of gate dielectric integration results in the same PFET and NFET oxynitride gate dielectric layers 18N/18P for the high-performance transistors with the thinnest gate dielectric layer. This is because when the thin gate dielectric layers 18N/18P are grown, both the NFET area 14 and the PFET area 16 in the substrate 12 are exposed to the same process. This is true whether the process is thermal-based or plasma-based, but a plasma process is shown for illustration.

In FIG. 4A, the device 10 is shown in an early stage of manufacture thereof comprising a silicon semiconductor substrate 12, which has been processed to contain both a P-doped NFET area 14 and an N-doped PFET area 16 in substrate 12.

In FIG. 4B, the device 10 of FIG. 4A is shown after a gate oxide layer 18N has been formed above the top surfaces of the NFET area 14 and gate oxide layer 18P has been formed above the top surfaces of the PFET area 16.

In FIG. 4C, the device 10 of FIG. 4B is shown after the gate oxide layers 18N/18P have been treated with a uniform plasma nitridation by driving nitrogen into the gate oxide layers 18N/19P above the top surfaces of the NFET area 14 and the P-doped PFET area 16. The same is true for a thermal nitridation.

In FIG. 4D, the device 10 of FIG. 4C is shown with the identical gate dielectric layers 18A in place of gate oxide layers 18N/18P. The identical gate dielectric layers 18A have been shaded with horizontal dash lines to show the transformation of the gate oxide layers 18N/18P into the identical gate dielectric layers 18A as a result of the uniform nitridation of the gate dielectric layers 18N/18P of FIG. 4C above the top surfaces of the NFET area 14 and the PFET area 16. Please note that FIG. 4D is composed of sections taken along lines A–A" and B–B" in FIG. 8A.

Because the optimum oxynitride is different for NFET and PFET devices, it is highly desirable to optimize the two separately, since the overall CMOS integrated circuit performance is determined by both NFET and PFET device performance. If the same gate dielectric layers 18N/18P were grown over NFET area 14 and the PFET area 16 at the same time, one device will be optimized, while the other will be sub-optimum. The fact that there is a suboptimum device may limit the overall CMOS circuit performance of the product.

U.S. Pat. No. 6,093,661 of Trivedi et al entitled "Integrated Circuitry And Semiconductor Processing Method of Forming Field Effect Transistors" teaches nitrogen atom concentration peaking at any elevational location in the gate dielectric layers of the device, but preferably at a location in the gate dielectric layers proximate the lower interface between the gate dielectric layers and the P and N doped regions of a monocrystalline silicon semiconductor substrate. Preferably, the concentration of nitrogen atoms is from 0.1% to 10.0% molar in the peak elevation region in the gate dielectric layer, preferably from 0.5% to 5.0% molar, with a thickness for the peak elevation region from 30 Å to 60 Å. Introduction of nitrogen into the gate dielectric layer can be done in a thermal processing furnace at a temperature from 750° C. to 950° C., ideally 850° C. at atmospheric pressure, with nitrogen provided at about 100 to 10,000 sccm, ideally 1,000 sccm, from 5 minutes to 2 hours, ideally 30 minutes. The preferred sources of nitrogen atoms have an N——O bond because of the ease of breaking the nitrogen bonds. However, other sources can be used, such as nitrogen oxide (NO), nitrous oxide ($N_2O$), ammonia ($NH_3$), and nitrogen gas ($N_2$). Otherwise Rapid Thermal Processing (RTP) introduces nitrogen atoms into the gate dielectric layer using one of the above nitrogen based compounds in a reactor heated to from about 800° to 1200° C. at atmospheric pressure with the temperature increasing at a rate from about 10° C. per second to 200° C. per second peaking at a time range of 10 seconds to 2 minutes. Alternatively nitrogen atoms are added to the gate dielectric layer using a nitrogen plasma treatment or a nitrogen ion implant. A goal of Trivedi et al is to produce Si——N bonds at least partially along the lower interface. A preferred purpose of Trivedi et al for the lower interface region is to prevent subsequent outdiffusion of p-type material from a PFET transistor gate layer (which is p-doped with boron) into a transistor channel. Another purpose of Trivedi et al is to restrict of further oxidation of the gate dielectric layer during later processing of the semiconductor substrate. Trivedi et al describes an optional further thermal processing of the semiconductor substrate performed after forming the nitrogen region to re-oxidize the gate dielectric layer. An example of such a reoxidation process is at 900° C. in pure $N_2$ at 1,000 sccm, $O_2$ at 6,000 sccm, $N_2$ at 50 sccm and employs a chlorine source gas at 50 sccm for a period of 50 minutes. Related patents included U.S. Pat. No. 6,417,546 of Trivedi et al entitled "P-Type FET in a CMOS with Nitrogen Atoms in the Gate Dielectric" and U.S. Pat. No. 6,541,395 of Trivedi et al entitled "Semiconductor Processing Method of Forming Field Effect Transistors".

U.S. Patent Application No. 20020130377 A1 published Sep. 19, 2002 of Khare et al., which is commonly assigned, entitled "Method For Improved Plasma Nitridation of Ultra Thin Gate Dielectrics" describes "forming a gate dielectric for an integrated circuit device . . . forming an initial oxynitride layer upon a substrate material, the oxynitride layer having an initial physical thickness. The initial oxynitride layer is then subjected to a plasma nitridation, the plasma nitridation resulting in final oxynitride layer having a final physical thickness." It is stated that "Nitrogen doping, particularly Remote Plasma Nitridation (RPN), is a known technique for increasing the dielectric constant (and hence the unit capacitance) of silicon oxide dielectrics, a known process of nitriding a gate oxide layer is illustrated." In addition it states that "a silicon substrate . . . is subjected to oxidation, such as by heating the substrate . . . in a oxygenated environment, thereby forming an insulating oxide layer . . . of $SiO_2$ . . . the dielectric performance of the oxide layer becomes increasingly important as gate thicknesses shrink into the deep sub-micron dimensions. In order to improve the dielectric constant of the oxide layer to achieve lower leakage current per unit capacitance, excited nitrogen atoms are introduced into the oxide layer by a process known as Remote Plasma Nitridation (RPN) . . . . As a result of the RPN process, the oxide layer . . . is converted to a silicon oxynitride layer . . . having the general chemical composition SiOxNy . . ."

The RPN process is a high temperature process which causes problems when using temperature sensitive materials.

U.S. Patent Application No. 20020185675A1, published Dec. 12, 2002, of Furukawa, which is commonly assigned, entitled "SOI Device With Reduced Junction Capacitance" describes an example of formation of a gate dielectric which "is silicon oxynitride formed by thermal oxidation followed by nitridation of the oxide by remote plasma nitration (RPN) or decoupled plasma nitridation (DPN"

U.S. Patent Application No. 20030100155 A1, published May 29, 2003 of Lim et al. entitled "Method for Fabricating Semiconductor Devices Having Dual Gate Oxide Layers " describes a selective DPN "decoupled treatment" process comprising a "method for forming a dual gate oxide layer, including the steps of: a) forming a gate oxide layer on a semiconductor substrate; and b) increasing a thickness of a part of the gate oxide layer by performing a decoupled plasma treatment. Additional heat processes are not necessary because the dual gate oxide layer is formed with the decoupled plasma. Also, the channel characteristic of the semiconductor device can be ensured because the silicon substrate is not damaged. Furthermore, because the threshold voltage in the cell region is increased without additional channel ion implantation, the electrical characteristic of the semiconductor device can be enhanced."The DPN treatment is employed for the "cell region I", but is not employed in the "peripheral circuit region II". While the cell region I and the peripheral circuit region II are differentiated, Lim et al. does not contemplate the concept of differentiation of CMOS NFET and PFET areas. Lim et al discloses a method of generating different gate dielectric thickness in a cell vs. peripheral regions of the chip, which will generate the same gate dielectric for NFET and PFET within each of the respective areas, while the method of the present invention separates NFET and PFET (which will have the same thickness). Multiple gate dielectric thicknesses on a single chip are quite common in the industry. For example, one might have a 15 Å, 30 Å, 70 Å gate dielectric on a single chip. However, within each dielectric thickness, the gate dielectric composition and thickness is the same for the NFET and the PFET dielectric layers, which is an industry standard.

The DPN process is a low temperature process, which avoids problems when using temperature sensitive materials.

In the Trivedi patent 6,541,395, nitrogen (N) is added to PFET gate dielectric layers for reduction of boron penetration, with no nitrogen (N) added to NFET gate dielectric layers. The electrical properties of the gate dielectric layers are much different between 5–20 Å (the preferred range of the present invention) and 30–50 Å(the preferred range of Trivedi et al.). Leakage reduction by increasing nitrogen concentration is typically observed only when the silicon oxide is below about 20 Å. The Trivedi et al. patents appear to be targeted at a much thicker oxide than the present invention. The reason Trivedi et al. puts N into the gate oxide of the PFET is that the addition of N to the gate oxide forms an oxynitride, which tends to block boron diffusion. That has the benefit of reducing boron penetration from the P+ polysilicon gate electrode into the channel of the PFET. In the sub 20 Åthickness range, gate leakage is reduced by oxynitride relative to pure $SiO_2$ for both NFET and PFET devices. Hence the present invention places N in both NFET and PFET gate dielectric layers.

The Trivedi et al. patents employ growth of nitrided silicon oxide first, resist masking and HF etch and growth of second (nitrogen-free) silicon oxide. The first silicon oxide is always thicker, since it is exposed to a second (nitrogen-free) oxide. Because the Trivedi et al. patents relate to a higher temperature thermal process, the processes described thereby will always result in a thicker second silicon oxide (thinner oxynitride for PFET and thicker $SiO_2$ for NFET). The thicker oxide on the NFET has the negative effect of reducing the transistor drive current. The present invention provides a means of creating oxides by employing a low temperature plasma which can eliminate the increase in physical thickness seen in high temperature oxidation as disclosed by the Trivedi et al. patents. Hence the present invention can achieve the same physical thickness in both NFET and PFET gate dielectric layers (avoiding the problem of reduced transistor current caused by the fact that any physical thickness increase decreases transistor current), while achieving different levels nitrogen concentration in the two different areas of a CMOS device, i.e. the NFET gate dielectric layers and the PFET gate dielectric layers.

SUMMARY OF INVENTION

With reference to Lim et al, a first very significant difference is that the present invention is based upon our discovery that the optimum composition of an NFET gate dielectric layer is different from the optimum composition of a PFET gate dielectric layer. This fact is not generally known, and we discovered it only through many experiments. Secondly, once we learned the above fact, we realized that it is highly desirable to generate different oxynitride concentration NFET and PFET gate dielectric layers to fully optimize CMOS performance. The present invention employs the use of a low temperature process such as DPN with the combination of a soft photoresist mask to achieve this enhanced result.

Distinguishing features of the present invention are as follows:Room temperature plasma enables use of a photoresist soft mask in patterning of the regions being treated with nitridation.

Nitrogen is introduced into both PFET and NFET areas (an additional area could include a decoupling capacitor with a capacitor dielectric layer which has been subjected to intense nitridation).

Nitrogen in NFET is beneficial for gate leakage reduction, but degrades mobility when the N concentration is too high.

Nitrogen in PFET reduces gate leakage/boron penetration, improves mobility. The combination of the previous two facts (which is not generally known) leads one to want to optimize PFET and NFET gate oxide separately.

The same base oxide is used for both NFET and PFET areas with nitrogen being optimized separately. Sample: areal N dose for NFET=0.8E15 to 1.2E15 $cm^{-2}$, N dose for PFET=1.5E15 to 2.5E15 $cm^2$. This configuration can be reversed depending on the application and desired results. This is merely an example that we have found to be particularly beneficial and preferred for methods of manufacture in accordance with our invention and products of those methods.

BRIEF DESCRIPTION OF DRAWINGS

The foregoing and other aspects and advantages of this invention are explained and described below with reference to the accompanying drawings, in which:

FIGS. 4A–4D illustrate four steps of a prior art process that illustrate how a standard sequence of processing steps of gate dielectric integration result in the same PFET and NFET oxynitride gate dielectrics for the high-performance transistors with the thinnest gate dielectric layer.

FIG. 11 shows a table summarizing the effect of different degrees of nitridation of gate dielectric layers for NFET vs. PFET sectors of a CMOS device.

DETAILED DESCRIPTION

A) Optimization of oxynitride gate dielectric for NFET and PFET devices is different for each device.

B) Because the optimum oxynitride composition is different for NFET and PFET devices, it is beneficial for overall CMOS performance (the combination of NFET and PFET) to optimize these separately for NFET and PFET devices.

C) The method of this invention is adapted for achieving the separate optimization of gate oxynitride for NFET and PFET devices within a single semiconductor chip.

As previously described, it is desirable to provide separate optimization of the gate dielectric layers 18N/18P for NFET and PFET devices, so that the overall performance of both NFET and PFET devices can be optimized. Several embodiments of the present invention are described below.

First Embodiment

In the embodiment of FIGS. 5A–5F, the process of formation of the of the lightly nitrided NFET gate dielectric layer 18C above P-doped NFET area 14 and more heavily nitrided PFET gate dielectric layer 18B above N-doped PFET area 16 in substrate 12 is completely decoupled by employing two separate lithography masking steps. In FIGS. 5A–5F, similar elements have similar reference numbers to the elements shown in FIGS. 4A–4D.

Figure 5A:
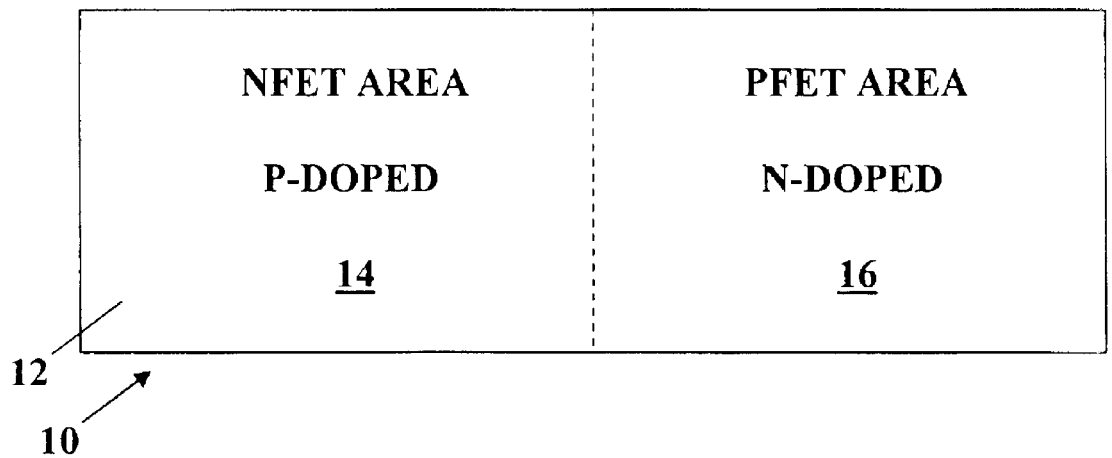
FIGS. 5A–5F illustrate a process in accordance with a first embodiment of this invention, wherein the steps of formation of the of NFET gate dielectric layer, on the one hand, and PFET gate dielectric layer, on the other hand, are completely decoupled by employing two separate lithography masking steps.

FIG. 5A shows the device 10 being manufactured in accordance with this invention in an early stage of manufacture. Device 10 includes a silicon semiconductor substrate 12, which has been processed to contain both a P-doped NFET area 14 and an N-doped PFET area 16 in substrate 12.

Figure 5B:
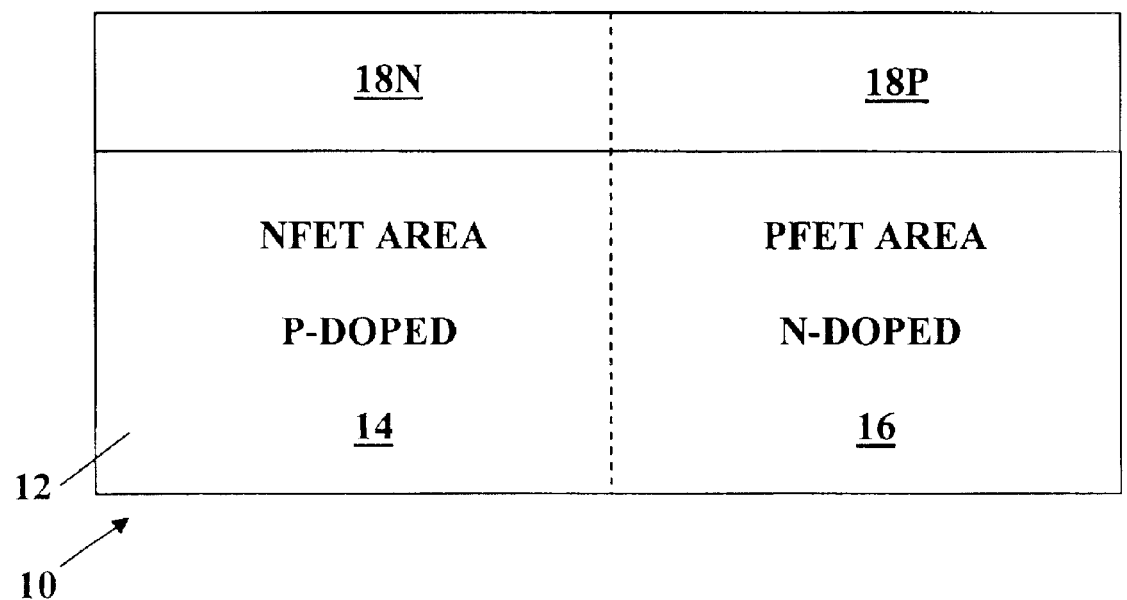
Figure 5C:
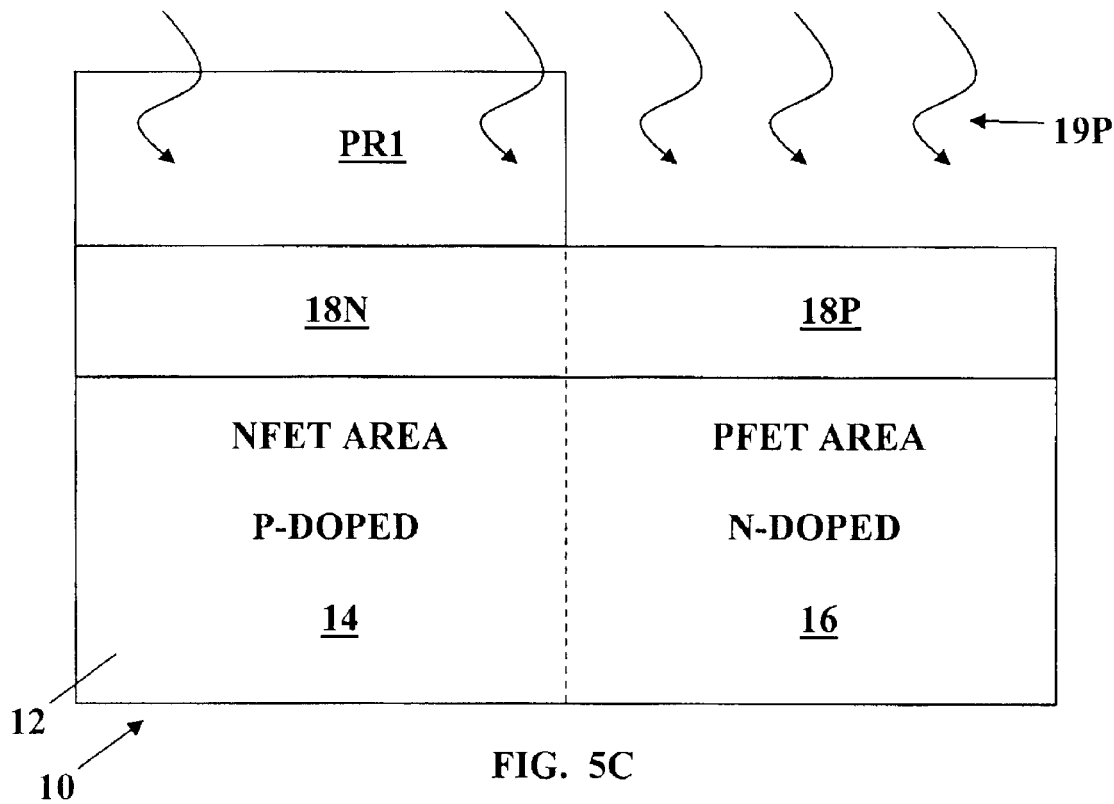

Process Steps for FIG. 5B:

(1aa) FIG. 5B shows the device 10 of FIG. 5A after formation of the gate oxide layers 18N/18P above NFET area 14 and PFET area 16 respectively (before forming a resist mask PR1 as shown in FIG. 5C.) To form the gate oxide layers 18N/18P, preferably the following steps have been performed of growing the thin base gate oxide layer 18N.18P ($SiO_2$ or $SiO_xN_y$).

Desired Film Characteristics:

The desired range of physical thickness of the thin base gate oxide layers 18N/18P is within the range from 5 Å–100 Å, with the preferred thickness depending on the specific application. For gate leakage reduction by incorporation of nitrogen the preferred thickness is 5 Å–20Å.

The composition ranges from silicon oxide ($SiO_2$) to some level of oxynitride with the percentage of nitrogen (N %) ranging from 0%–30%, with a preferred range being 3–10%.

Furnace (Batch Process):

Gas: $O_2$, NO, $N_2O$, $NH_3$ or combination

Temperature range 600° C.–1000° C., 700–850° C. preferred

Pressure: 10 Torr–760 Torr

Time is from 5 minutes to 3 hours, but preferably 20–60 min, or as an alternative to (1aa) perform the steps in (1ab) below.

(1ab) Single Wafer Rapid Thermal Processor (RTP):

Gas: $O_2$, NO, $N_2O$, $NH_3$ or combination

Temperature range 700° C.–1100° C., 800–950° C. preferred

Pressure: 10 Torr–760 Torr

Time is from 5 sec. to 400 sec., but preferably 15–30 sec.

First Photolithography Step-Form Mask Blocking PFET or NFET Gate Oxide Layers:

(1b) FIG. 5C (which is a modification of FIG. 4C) shows the device 10 of FIG. 5B after performing the second step in the process of forming a standard blocking photoresist (resist) mask PR1 to cover gate oxide areas 18N but to expose the gate oxide 18P over the PFET areas 16. In other words, the mask PR1 covers the oxide over the NFET areas 14, but exposes the oxide 18P over the PFET areas 16. That is to say that the blocking resist mask PR1 covers the gate oxide layer 18N above the NFET area 14 leaving the portion of the gate oxide 18P above the PFET area 16 exposed.

Nitridation of First Gate Oxide Region:

(1c) FIG. 5C also shows the device 10 of FIG. 5B during nitridation of the gate oxide layer 18P of FIG. 5B above the PFET area where the wafer surface is exposed 16 by plasma nitridation with nitrogen containing plasma 19P. On the other hand, the plasma 19P does not produce nitridation of the gate oxide layer 18N above the NFET area 14 because the resist mask layer PR1 prevents the nitrogen plasma 19P from reaching the oxide surface 18N over the NFET area 14. Processing parameters for step (1c) are described next.

Perform first low temperature plasma nitridation (to preserve photoresist PR1, cannot use high temperature process).

Desired Film Characteristics:

Physical thickness 5 Å–100 Å, preferred thickness depends on specific applicationOxynitride composition ranges from N % of 1–30%, depending on specific application, with 5–15% being preferred.

Low Temperature Plasma Nitridation:

Plasma source: standard plasma generator, but preferably RF (radio-frequency)Nitrogen source gas: preferably $N_2$, but NO, $N_2O$, $NH_3$ possibleCarrier gas: preferably He or Ar, but Kr also possibleTemperature: 15° C. 100° C., preferably 25° C. Pressure: 1 milliTorr to 1 Torr, preferably 10 milliTorr to 200 milliTorrPower from 50 W to 1000 W, but preferably 100 to 200 WTime is from 5–400 sec, but preferably 15–30 sec.

Figure 5D:
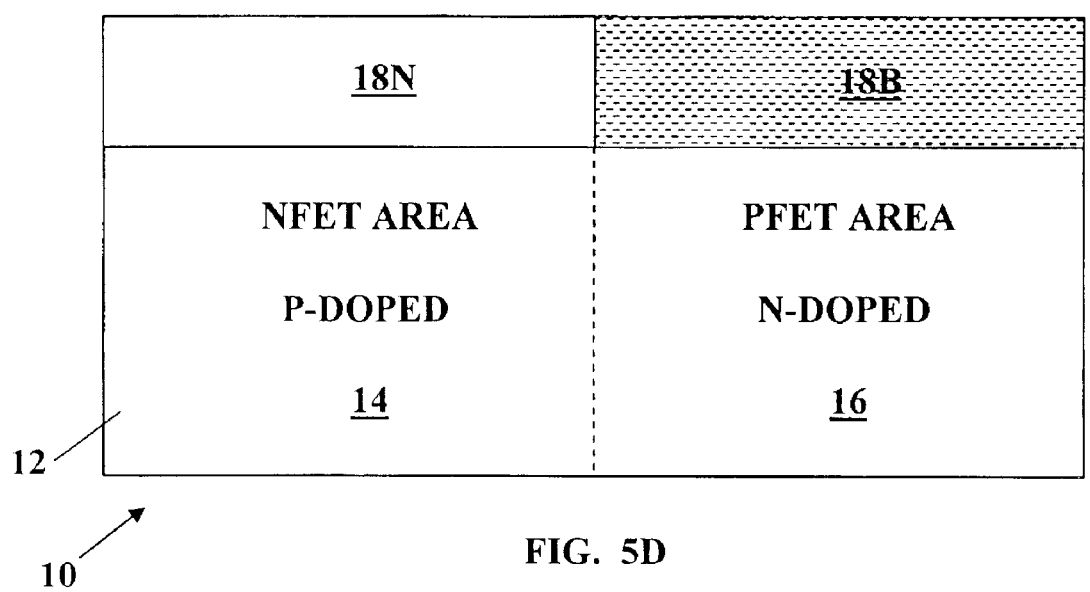

(1d) The result of the process of FIG. 5C is shown in FIG. 5D where the gate oxide layer 18P has been nitrided to be converted into gate dielectric layer 18B by the step (1c) above as shown with the gate dielectric layer 18B which has been shaded with horizontal dash lines to show the formation of the gate dielectric region 18B by relatively heavy nitridation of the gate oxide layer 18 above the top surfaces of the N-doped PFET area 16, while gate oxide layer 18N remains in its previous condition at the end of FIG. 5B. In other words, (e.g. PFET) $SiO_2$ areas 18B exposed through mask PR1 have been nitrided by the plasma 19P, while the (e.g. NFET) layer 18N covered by the resist mask PR1 were protected from the nitridation.

Strip First Mask:

FIG. 5D also shows the device 10 of FIG. 5C after the resist mask PR1 has been stripped from device 10 with a standard photoresist strip.

Figure 5E:
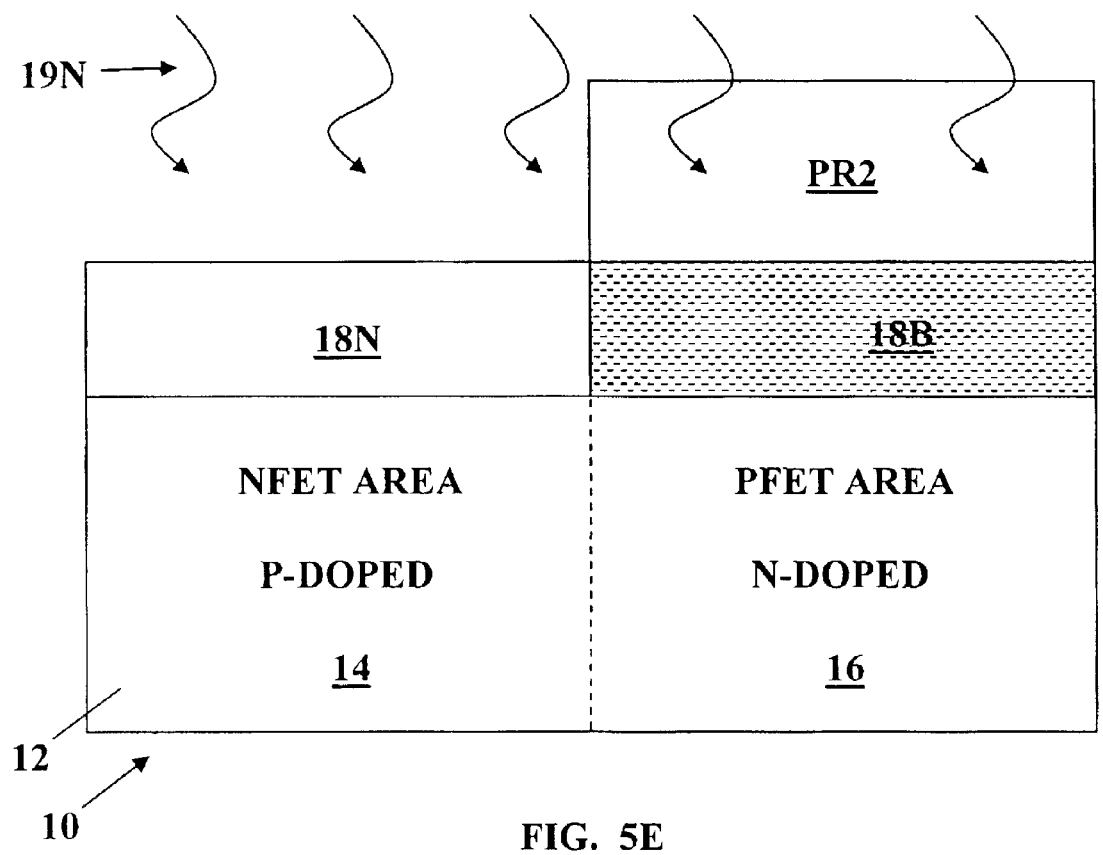

Second Photolithography Step-Form Mask Blocking NFET or PFET Gate Oxide Layers:

(1e) FIG. 5E shows the device 10 of FIG. 5D after performing a second photolithography step so that now the opposite areas are covered (e.g. covering the PFET gate dielectric layer 18B and exposing the NFET gate oxide layer 18N) forming the blocking resist mask PR2 above the gate dielectric region 18B, leaving the remaining NFET gate oxide region 18N exposed above the NFET area 14.

Second Plasma Nitridation:

(1f) Referring again to FIG. 5E, the next step is to perform another plasma nitridation (second plasma nitridation with nitrogen containing plasma 19N to perform nitridation of the NFET gate oxide layer 18N above the NFET area 14 to convert it into a gate dielectric layer 18C (FIG. 5F), but this step in the process does not perform nitridation of the PFET gate dielectric layer 18B because of the blocking resist mask PR2.

Figure 5F:
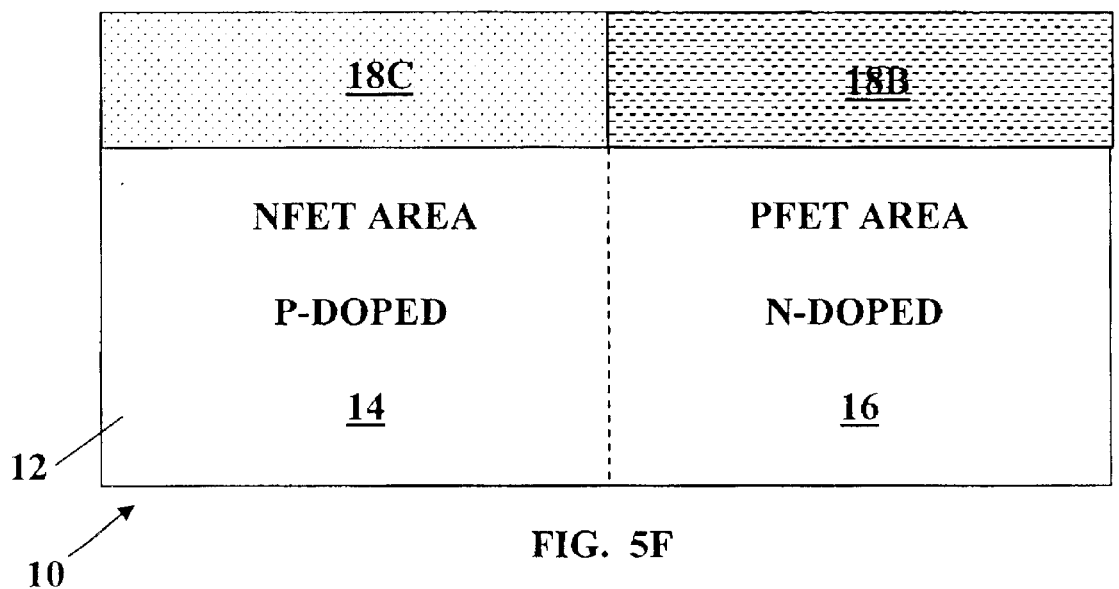

FIG. 5F shows the device 10 of FIG. 5E after using the above sequence which completely decouples the NFET and PFET regions of device 10, so that the nitrogen concentration and process can be separately optimized for the NFET gate dielectric layers 18C and the PFET gate dielectric layers 18B of NFET/PFET areas 14/16 of device 10.

Either the heavier or lighter nitridation can be performed first, since there are two masking steps (PR1/PR2), the order can be reversed.

Desired Film Characteristics:

Physical thickness 5 Å–100 Å, preferred thickness depends on specific application; and 5 Å–20 Å is preferred if gate leakage current reduction is desired.

Oxynitride composition ranges from N % of 1–30%, depending on specific application, with 5–15% being preferred.

Low Temperature Plasma Nitridation:

Plasma source: standard plasma generator, but preferably RF (radio-frequency)Nitrogen source gas: preferably $N_2$, but NO, $N_2O$, $NH_3$ possibleCarrier gas: preferably He or Ar, but Kr also possible.

Temperature: 15° C. 100° C., preferably 25° C.

Pressure: 1 milliTorr to 1 Torr, preferably 10 milliTorr to 200 milliTorrPower from 50 W to 1000 W, but preferably 100 to 200 WTime is from 5–400 sec, but preferably 15–30 sec.

In this particular example, the process conditions for the first plasma nitridation on the PFET areas represented by gate oxide layer 19P will be such that it will introduce more nitrogen than the NFET process represented by gate oxide layer 19N. The higher nitrogen concentration of the process of nitridation of gate oxide layer 19P can be achieved by a variety of parameters such as longer time, higher power, or lower pressure.

Strip Second Mask:

(1g) Perform resist strip process to remove the mask PR2 as shown in FIG. 5F where the gate dielectric layer 18C which has been lightly shaded with dots to show the result of nitridation of the gate dielectric region 18C of the gate oxide layer 18N that has been lightly nitrided above the top surfaces of the P-doped NFET area 14 but not above the N-doped PFET area 16 that had been previously more heavily nitrided as described above.

Figure 10:
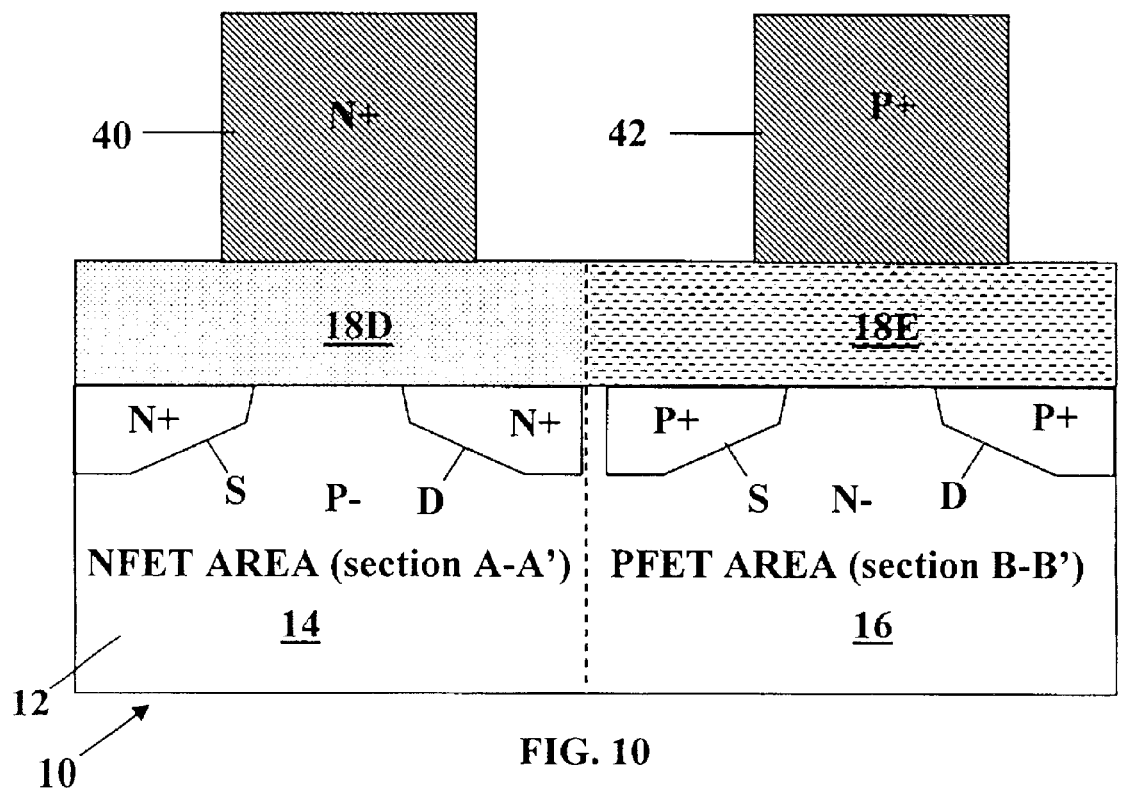
FIG. 10 shows the device of FIG. 6D, in accordance with this invention, after formation of gate electrodes over the gate dielectric layers of each of the NFET area and PFET area followed by formation of self-aligned source and drain regions in each of the NFET area and PFET area of the device.

(1h) Proceed with normal process flow to build transistor, e.g. perform polysilicon gate deposition as illustrated by FIG. 10.

The descriptions of the second and third embodiments found below contain less detailed descriptions of the base oxide and plasma nitridation since these ranges are unchanged from the first embodiment.

Second Embodiment

Figure 6A:
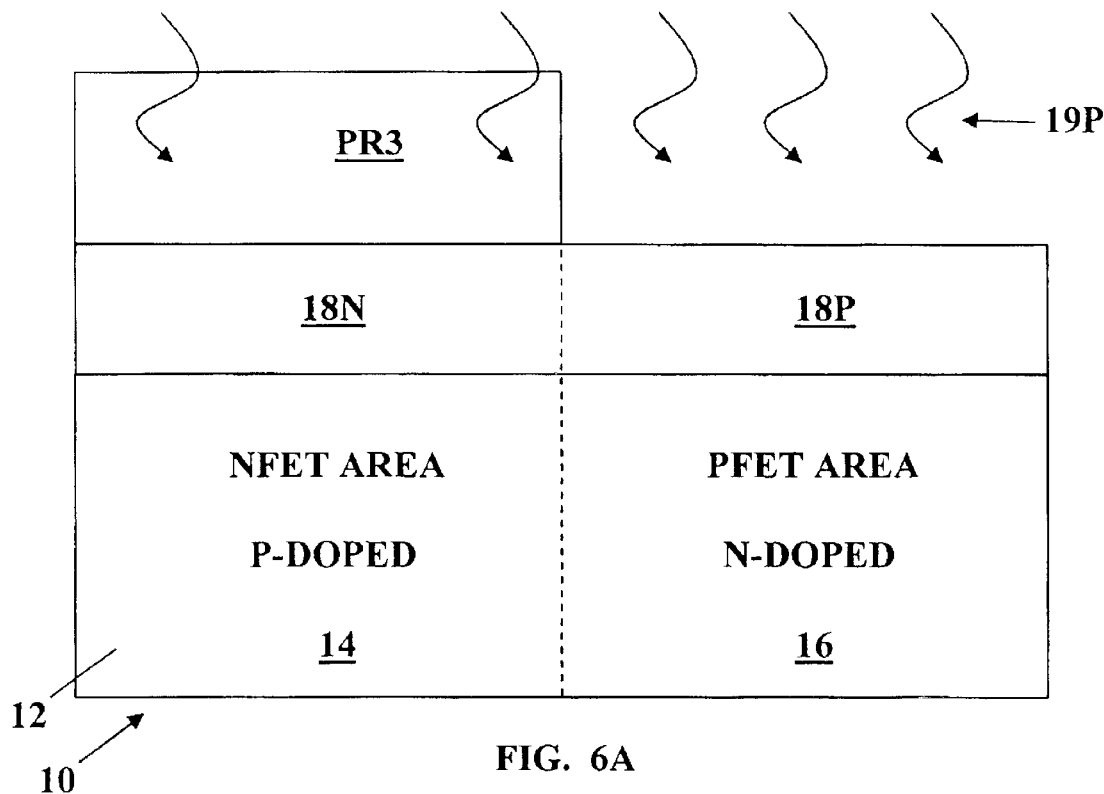
FIGS. 6A–6D illustrate a process in accordance with a second embodiment of this invention, wherein, there are decoupled NFET and PFET gate dielectric regions as shown in FIG. 6D formed by a process using a single lithography masking step as contrasted to the dual masking steps of the first embodiment as illustrated by FIGS. 5A–5F.
Figure 6B:
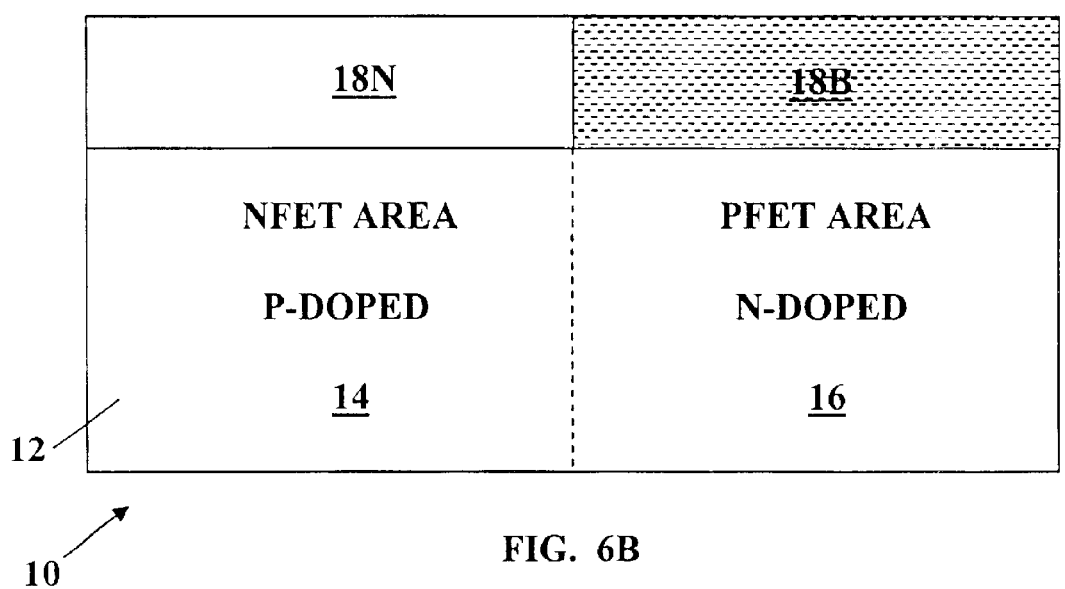
Figure 6C:
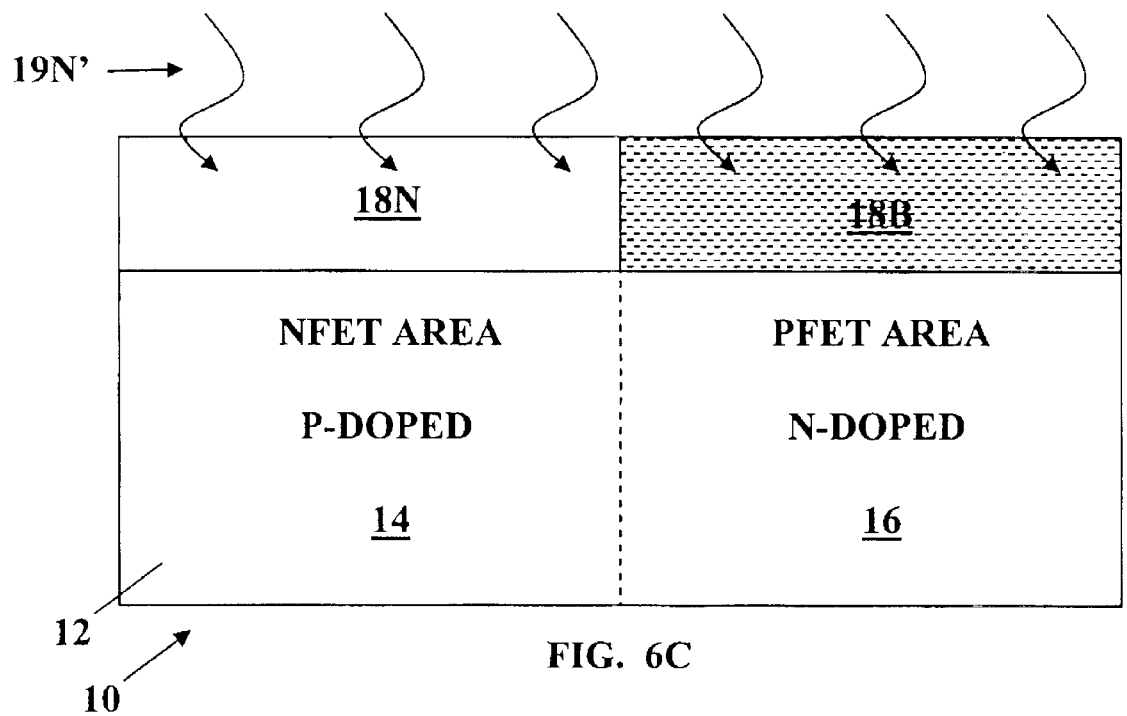
Figure 6D:
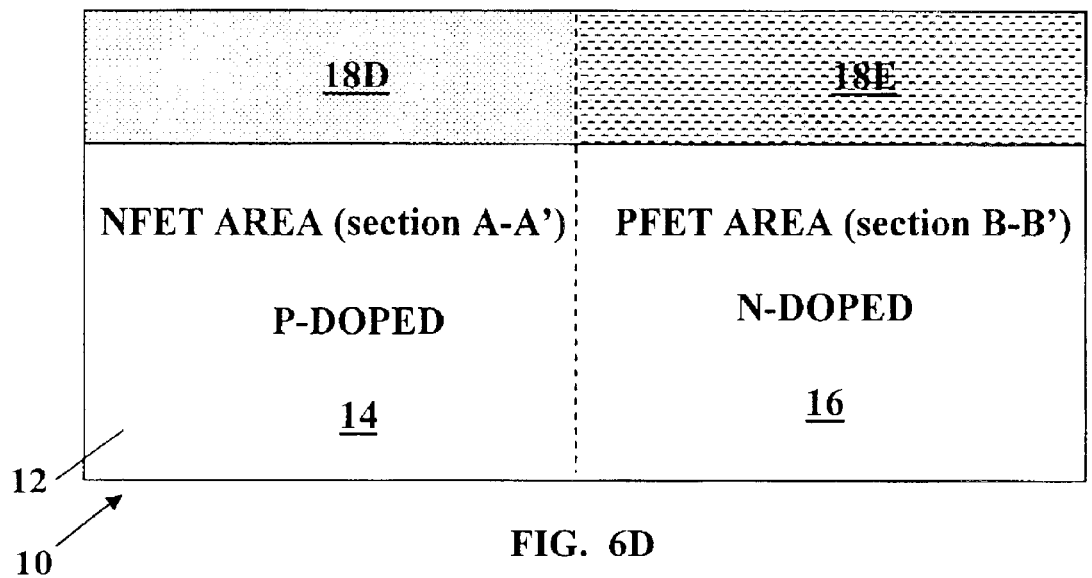

In the case of this method, which is described with reference to FIGS. 6A–6D, there are decoupled NFET and PFET gate dielectric regions 18D and 18E as shown in FIG. 6D using a single lithography masking step as contrasted to the dual masking steps of the first embodiment as illustrated by FIGS. 5A–5F.

(2a) Referring to FIG. 6A, the thin base gate oxide layers 18N/18P ($SiO_2$ or SiOxNy) have been grown, as described above with reference to step (1aa) or step (1ab) of the first embodiment.

(2b) Use a photoresist mask PR3 to cover the left hand portion of the NFET gate oxide 18N where the gate dielectric device areas 18D in FIG. 6D are to be more lightly nitrided (e.g. Cover the gate oxide layer 18N over the NFET area 14 and expose the gate oxide layer 18P over the PFET area 16).

(2c) Referring again to FIG. 6A, a masked first plasma nitridation with plasma 19P is being performed that contains much of the necessary nitrogen concentration and process for the more heavily nitrided gate dielectric 18E of FIG. 6D to be formed above the PFET area 16. See above for process details.

(2d) Strip the resist mask PR3. FIG. 6B shows the device 10 of FIG. 6A after removal of the mask PR3 and shows the gate dielectric layer 18B where the gate oxide layer 18P has been heavily nitrided above the PFET area 16.

(2e) Referring to FIG. 6C, an additional (second) lighter plasma nitridation with plasma 19N" is being performed to introduce nitride into both the gate oxide layer 18N and partially nitrided PFET gate dielectric layer 18B. This second unmasked plasma nitridation increases the nitrogen concentration in the nitrided gate dielectric layer 18B to form the heavily doped PFET gate dielectric layer 18E that reaches the required level to optimize the PFET gate dielectric layer 18E and to provide an NFET gate dielectric layer 18D above the NFET area 14, which has been lightly nitrided, as shown in FIG. 6D.

Alternatively one can perform more lighter nitridation first without the mask, then perform the second nitridation with the NFET gate dielectric layer 18D masked.

(2f) Proceed with remainder of process flow to build transistors (e.g. polysilicon deposition)Using this sequence decouples the NFET and PFET regions of device 10, but not completely because the concentration of nitrogen in the more heavily nitrided NFET gate dielectric layers 18E is the sum of the two nitridation steps. This sequence saves a masking step as compared to the first embodiment.

Third embodiment

Figure 7A:
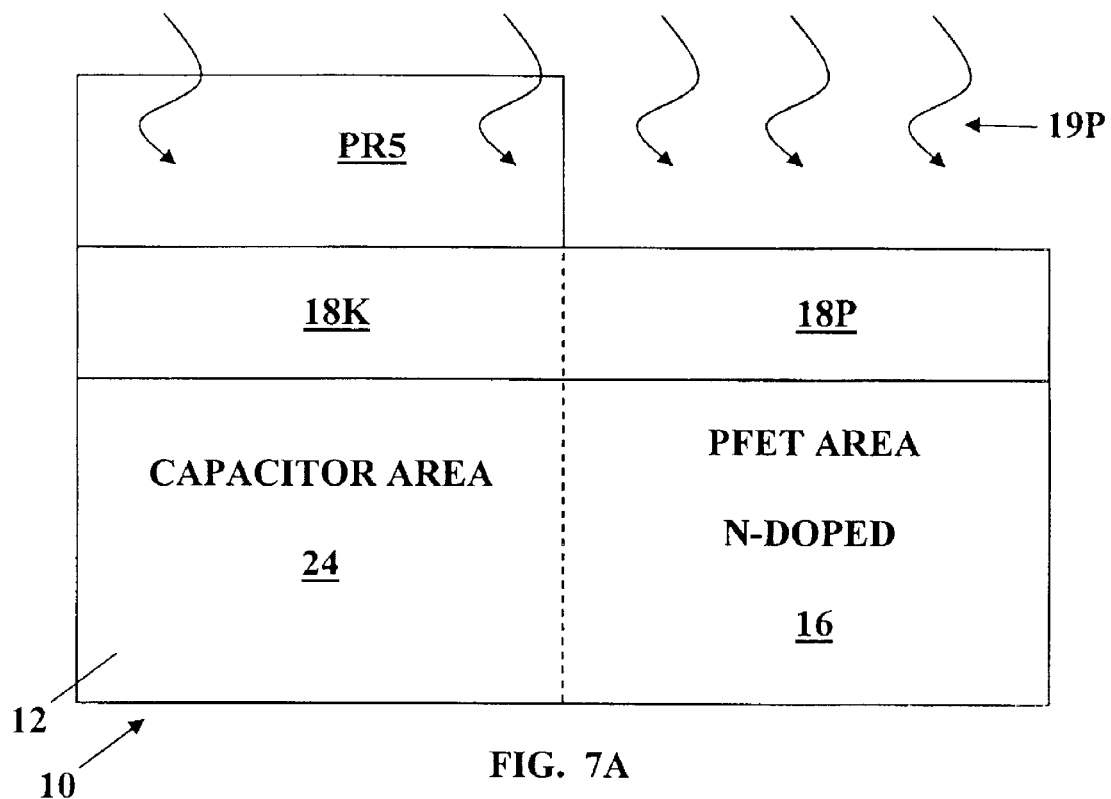
FIGS. 7A–7D illustrate a process in accordance with a third embodiment of this invention, wherein the process of providing nitridation producing a layer of heavily nitrided silicon oxide useful for capacitor dielectric layers over a capacitor region of the device in combination with nitridation of another region of the device which may be a PFET area or an NFET area, with only one being shown for convenience of illustration.
Figure 7B:
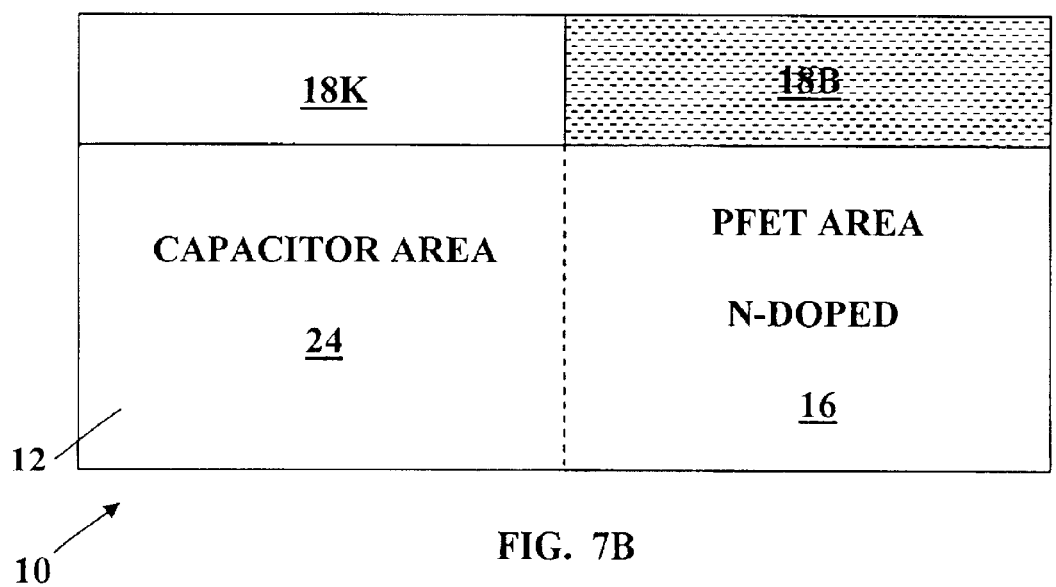
Figure 7C:
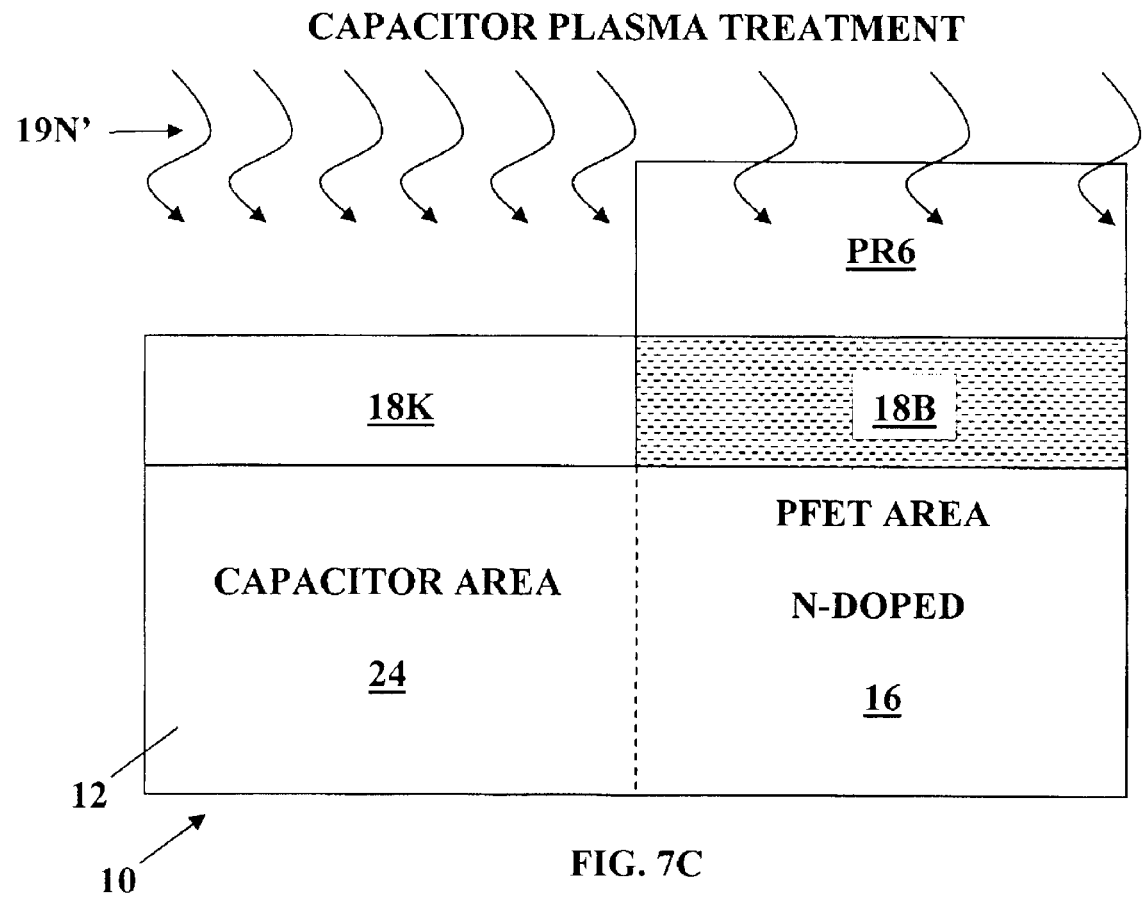
Figure 7D:
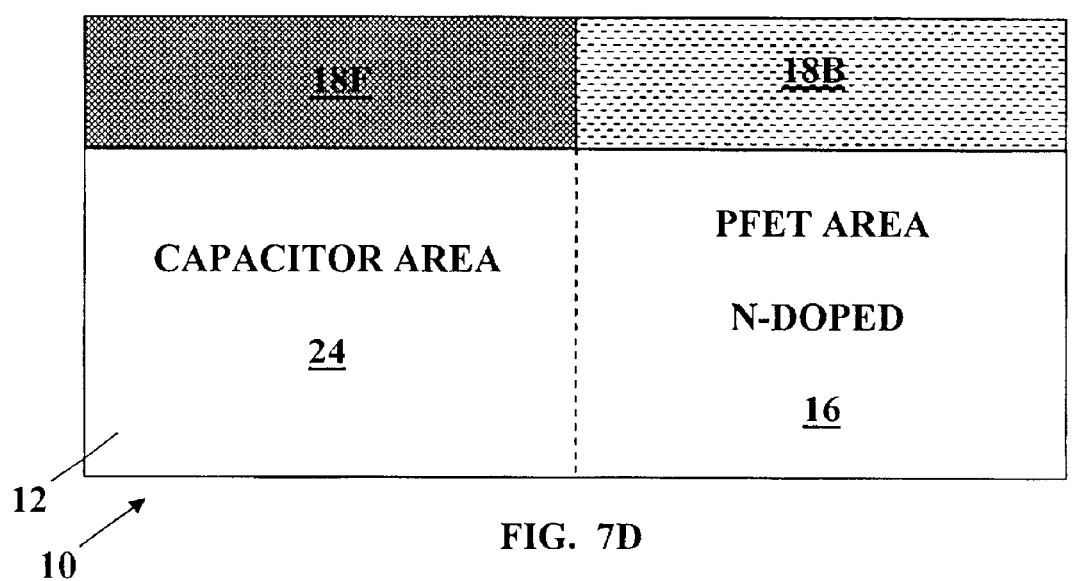

FIGS. 7A to 7D show the process of providing nitridation for heavily nitrided silicon oxide useful for capacitor dielectric layers 18F over a capacitor area 24 (as shown by FIG. 7D) in combination with nitridation of an area which may be a PFET area 16 (or an NFET area 14, with only the PFET area 16 being shown for convenience of illustration). The desired properties of a capacitor dielectric layer are high capacitance per unit area, low leakage, and high reliability. Capacitors do not require high mobility, since there is no transistor conduction current. Hence it is desired to incorporate as much nitrogen as necessary to optimize the dielectric constant of the film, so that the capacitor becomes less leaky and has a higher capacitance per unit area density.

The process sequence is as follows.

3a) As in embodiments described above, grow the base oxides 18P/18N for the transistor (NFET and PFET areas 14/16) and the base oxides 18K for capacitor areas 24. These base oxides 18K and 18P/18N may have different oxide thicknesses, if necessary, generated by standard oxidation and integration sequences as shown by FIGS. 7A and 7B where the nitridation above the PFET area 14 with plasma 19P has provided a nitrided gate dielectric 18B (above the PFET area 16) with the mask PR5 above the silicon oxide layer 18K over capacitor area 24 on the left protected by the mask PR5. Thus, the silicon oxide layer 18K is left without any nitridation at this point.

3b) Then as shown by FIG. 7C a photolithography masking step is performed on the device of FIG. 7B to cover the nitrided gate dielectric layer 18B, etc. in transistor areas with a mask PR6. The protected areas include gate dielectric layer 18B for the PFET area 16 and gate dielectric layers 18C for NFET areas 14 (not shown in this view). The mask PR6 leaves the silicon dioxide layer 18K exposed over the capacitor areas 24.

3c) FIG. 7D shows the device 10 of FIG. 7C after exposing the open capacitor areas in FIG. 7C to a plasma 19N", that nitrides the capacitor dielectric layers 18F in FIG. 7D to the appropriate nitrogen concentrations. Typically this concentration will be heavier than the transistor (NFET and PFET) areas since mobility is not a concern, only the leakage and capacitance must be optimized.

Any of these embodiments may be applied to any high-K gate dielectric (such as $HfO_2$, $HfSiO_2$, $ZrO_2$, etc.) integration which requires or benefits from a selectively optimized plasma nitridation in different device regions, such as NFET or PFET devices.

Figures 8A, 8B, 8C:
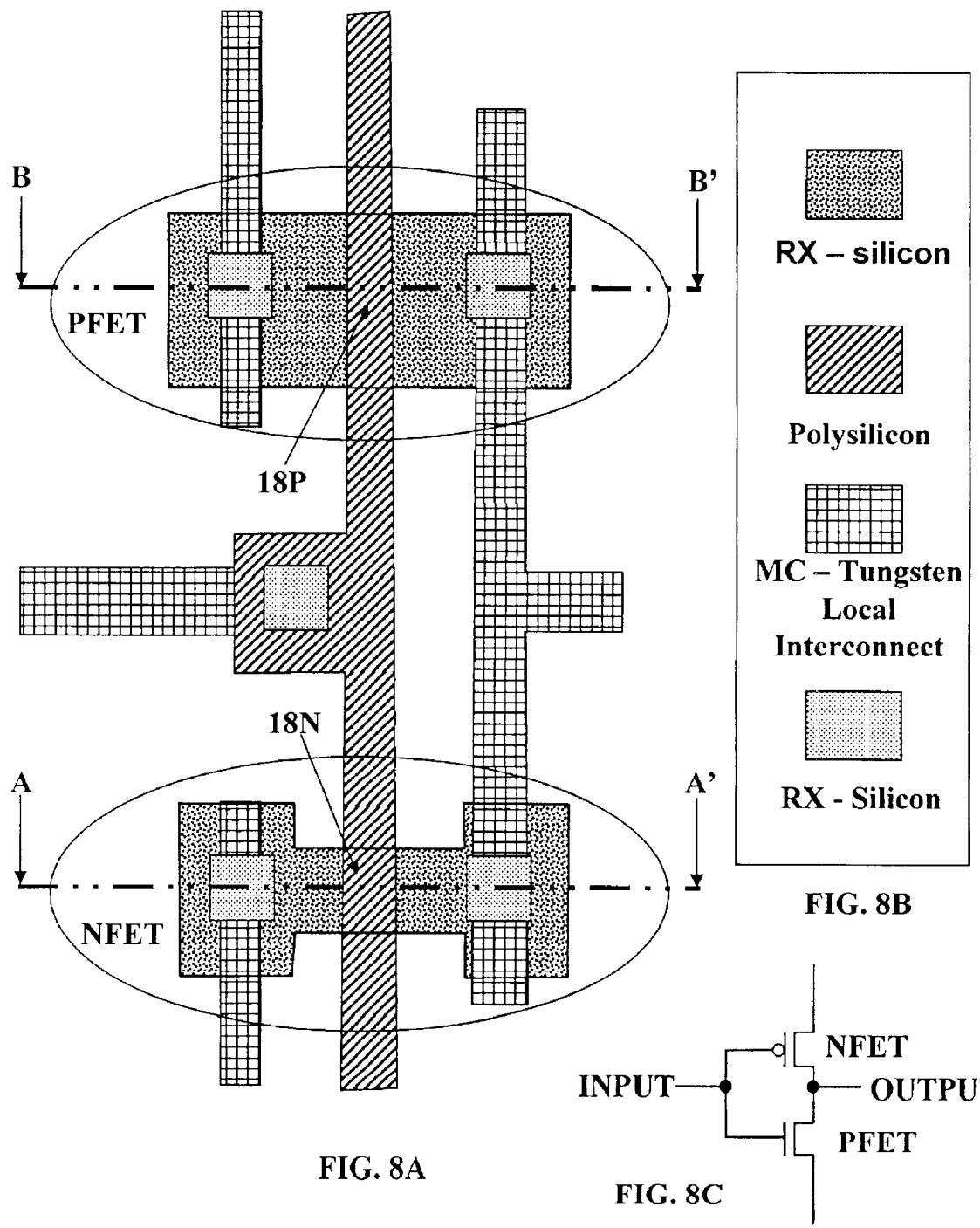
FIG. 8A shows a plan view of an inverter circuit (NFET and PFET device connected as shown) in accordance with this invention and the prior art.
FIG. 8B shows the key to the shading in FIG. 8A.
FIG. 8C is a schematic circuit diagram of the device of FIG. 8A.

FIG. 8A shows the plan view of an inverter circuit (NFET and PFET device connected as shown) in accordance with this invention and the prior art.

FIG. 8B shows the key to the shading in FIG. 8A.

FIG. 8C is a schematic circuit diagram of the device of FIG. 8A Referring to FIG. 8A, by looking at the composition of the gate oxide in the devices of such a circuit (the inverter is the building block of all CMOS circuits), one can easily determine whether the nitrogen concentration in the gate dielectric layer above the NFET area 14 is same as the nitrogen concentration in the gate dielectric layer above the PFET area 16 by using analytical techniques well known to those skilled in the art.

Standard gate dielectric integration sequence will result in the same nitrogen concentration in the NFET and PFET areas.

The present invention provides different nitrogen concentrations in gate dielectrics for NFET and PFET gate dielectric layers, which is beneficial, and provides a method for achieving such a configuration.

Figure 1:
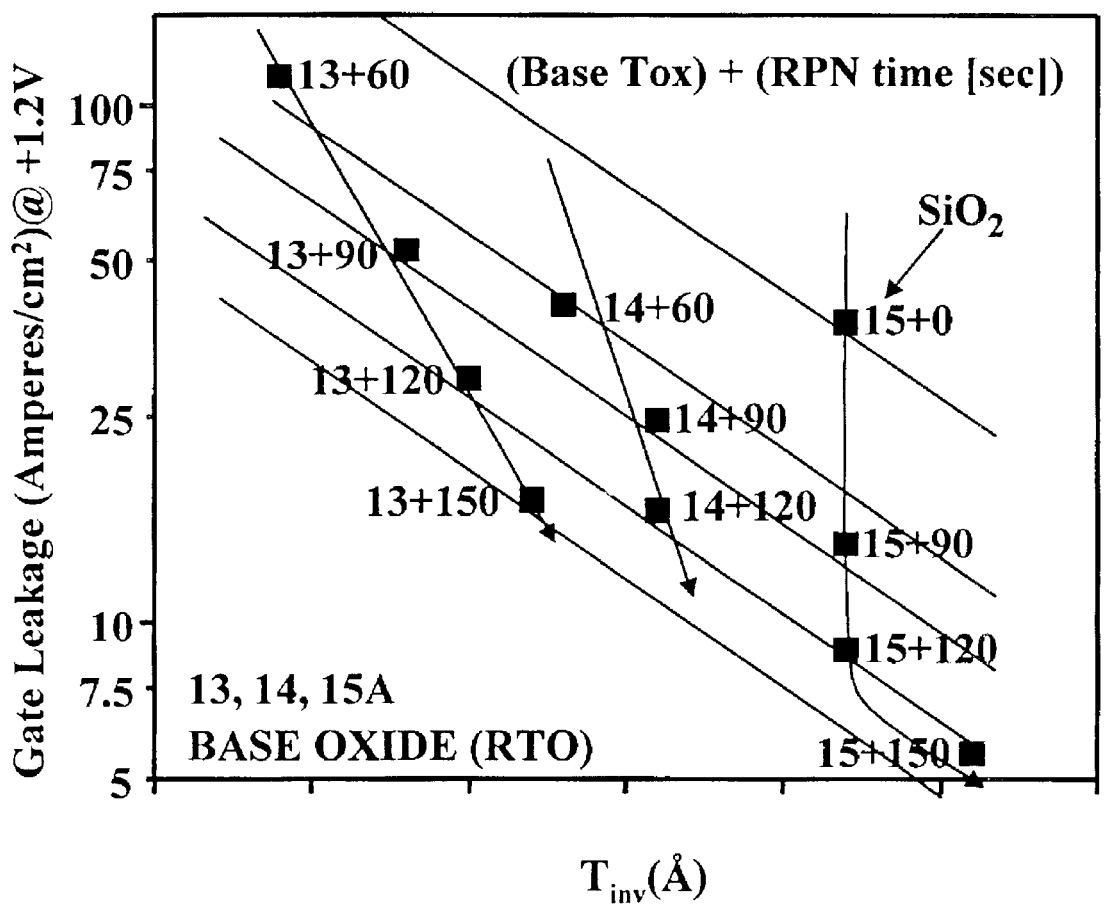
FIG. 1 shows how the gate leakage current decreases with increasing the duration of processing when using a Remote Plasma Nitridation (RPN) process of forming oxynitrides.
Figure 2A:
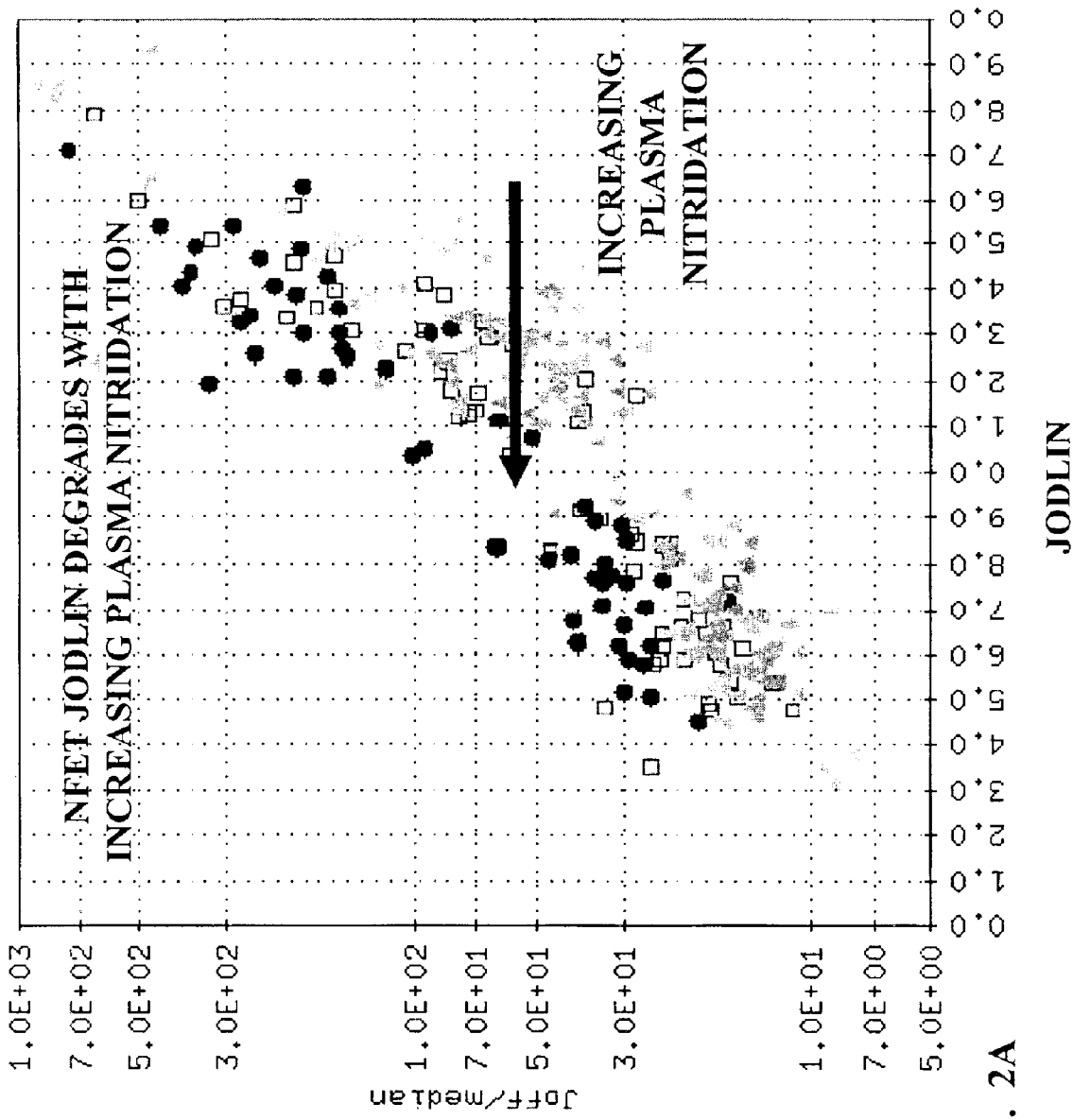
FIG. 2 shows an example of how plasma nitridation affects the PFET and NFET device drive current differently.
Figure 2B:
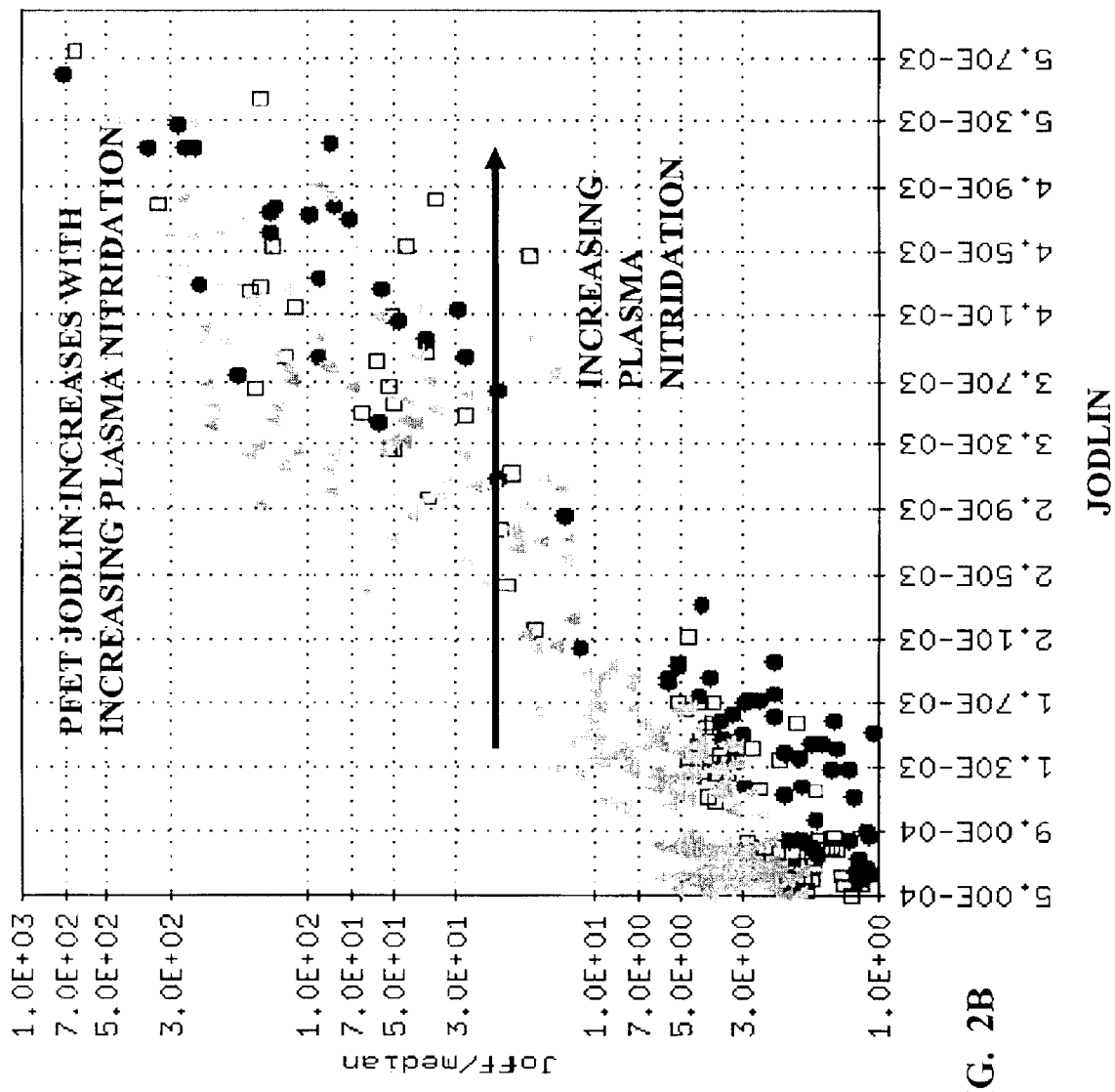
Figure 3A:
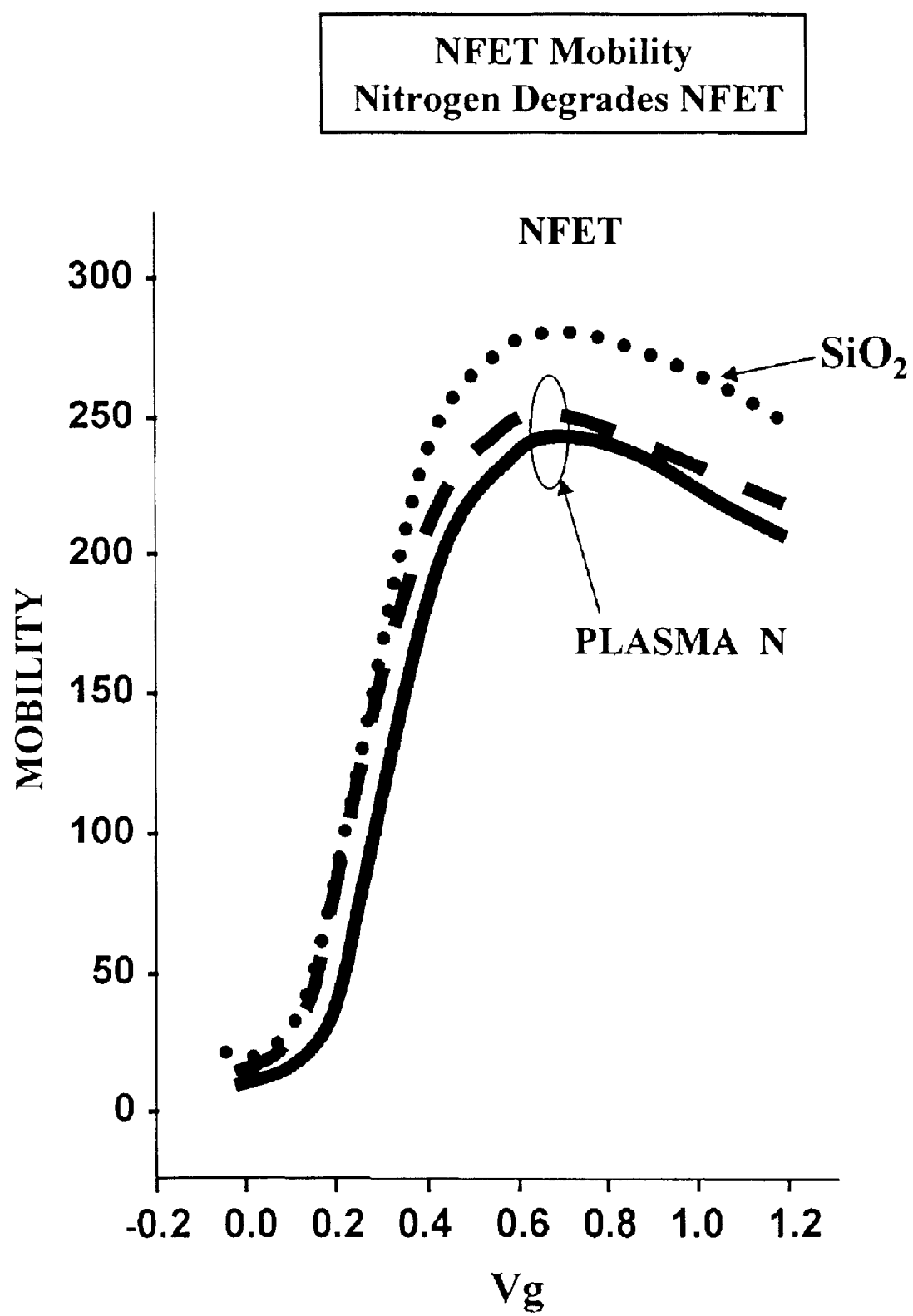
FIG. 3 shows another example of how plasma nitridation affects the PFET and NFET device drive current differently.
Figure 3B:
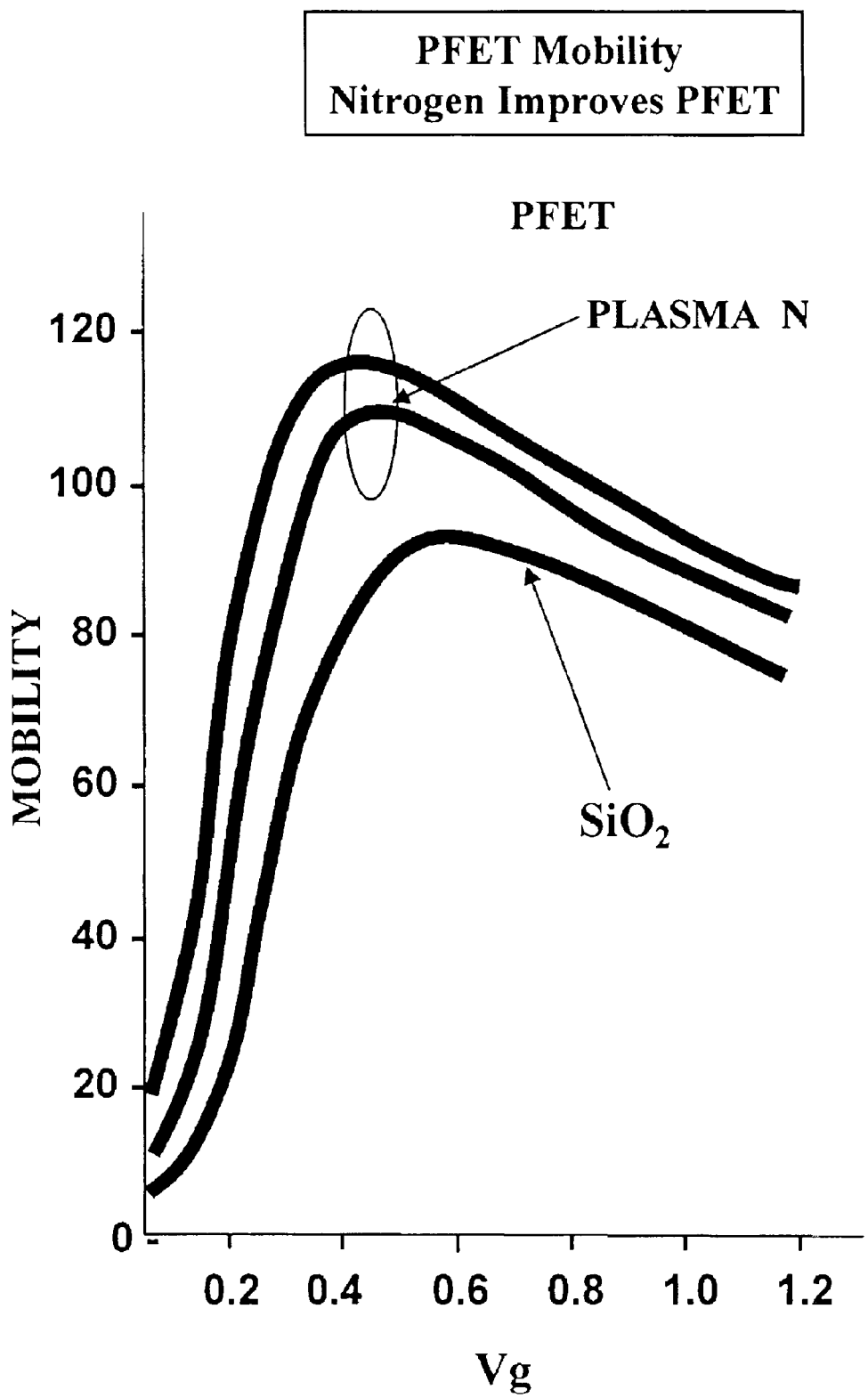
Figure 4A:
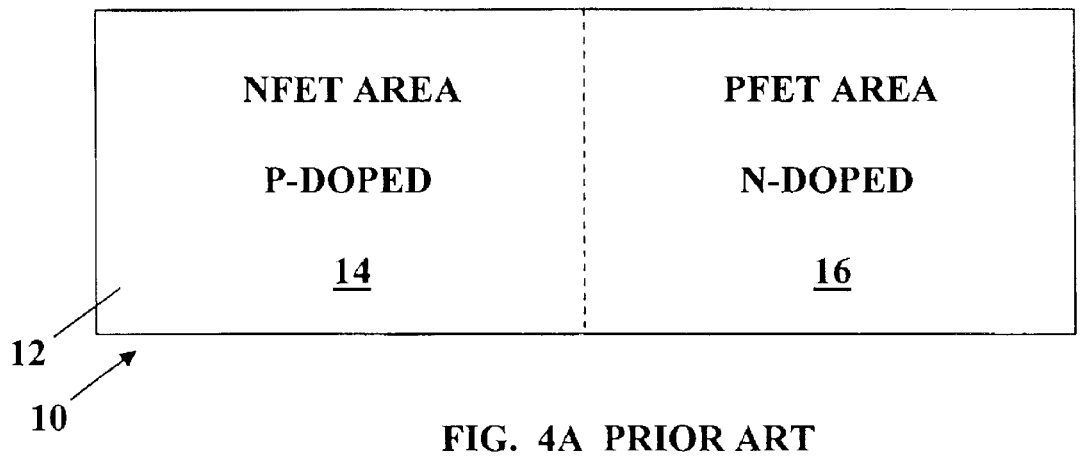
FIGS. 4A–4D are schematic conceptual diagrams, wherein as indicated in FIG. 4D, the drawings show two juxtaposed sections taken along lines A–A" and B–B" in FIG. 8A. The two juxtaposed sections are PFET and NFET sectors of a semiconductor device formed in a silicon substrate.
Figure 4B:
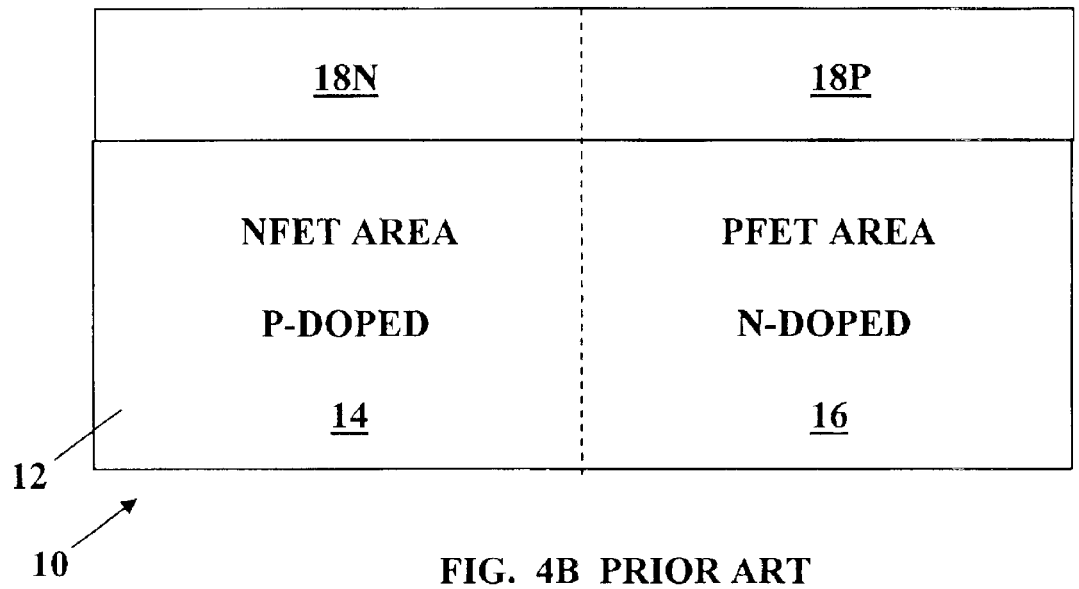
Figure 4C:
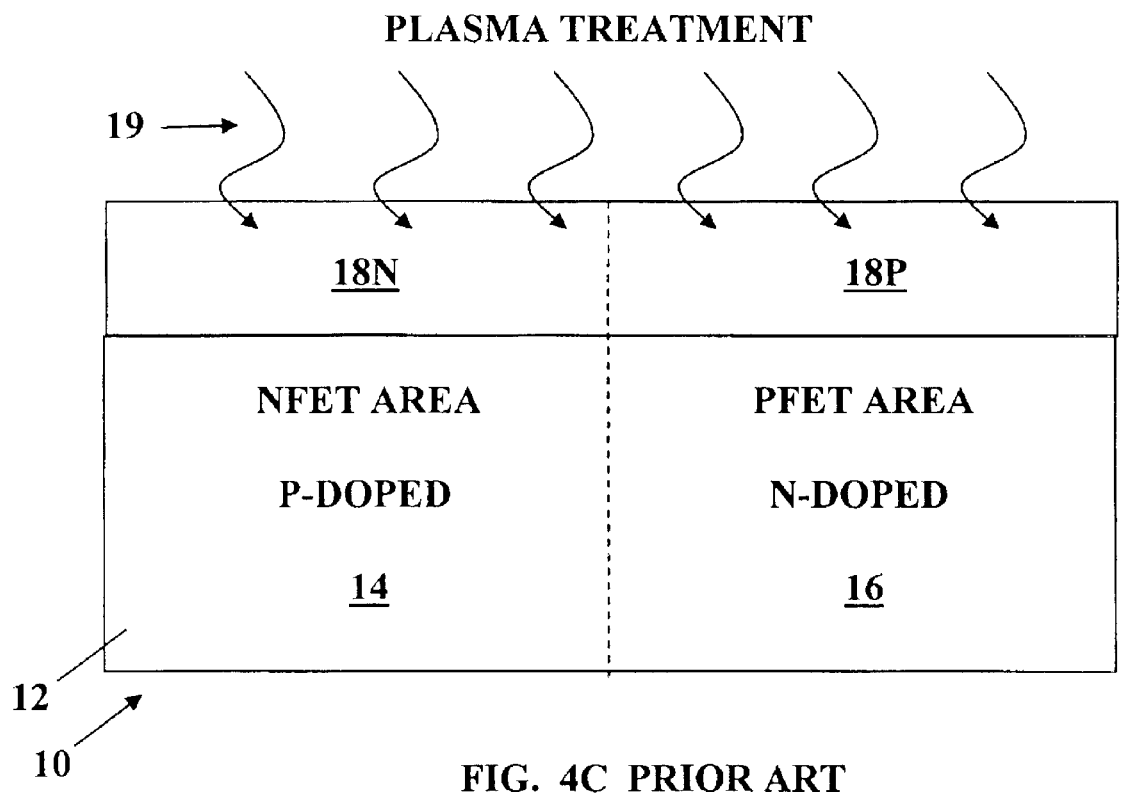
Figure 4D:
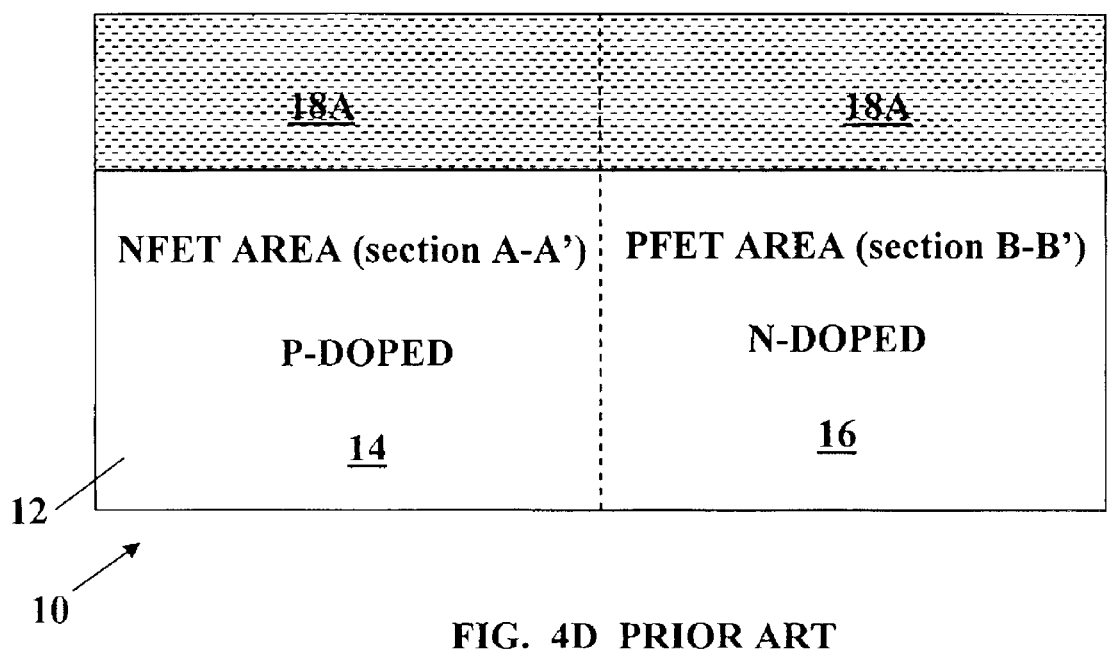
Figure 9:
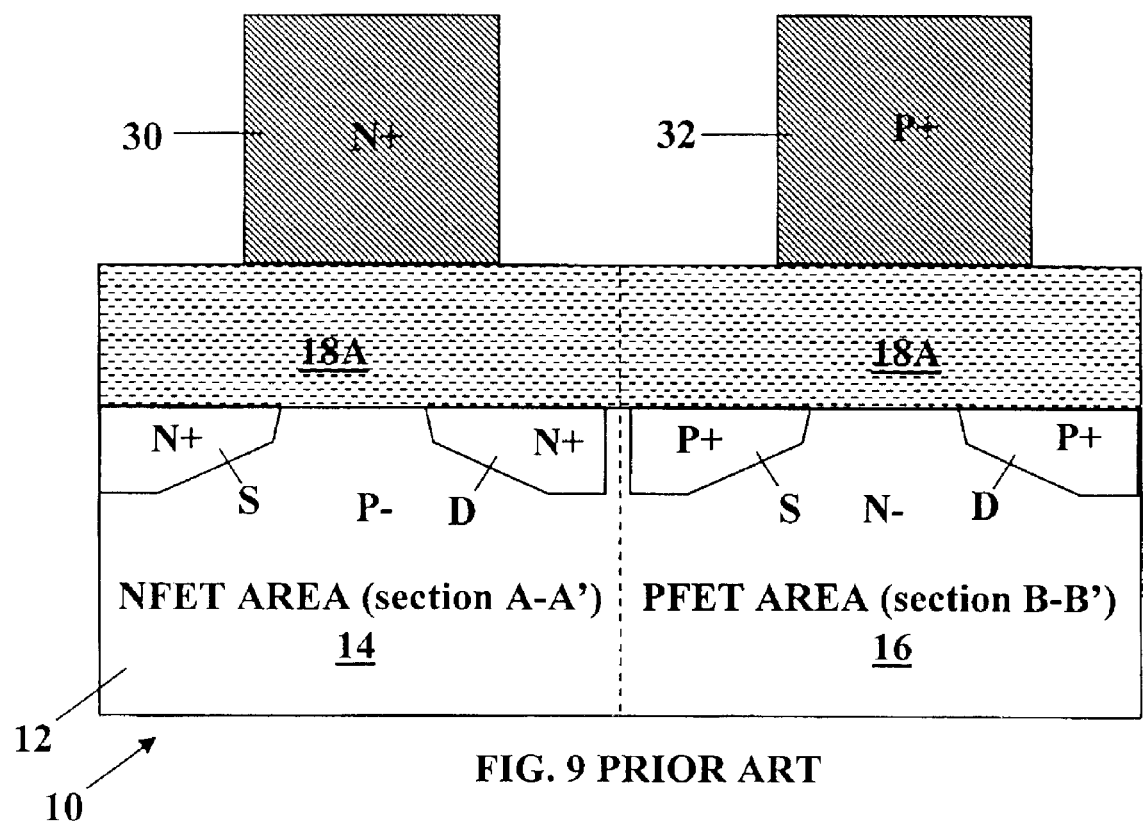
FIG. 9 shows a sectional view taken along the prior art device of FIG. 5D after formation of gate electrodes over the gate dielectric layers of each of the NFET area and PFET area followed by formation of self-aligned source and drain regions in each of the NFET area and PFET area of the device.

FIG. 9 shows the device 10 of FIG. 4D which is similar to the teachings of the Khare et al. published patent application after formation of gate electrode 30/32 over the gate dielectric layers 18A of each of the NFET area 14 and PFET area 16 followed by formation of self-aligned source S and drain D regions in each of the NFET area 14 and PFET area 16 of the device 10. A significant characteristic of the subject matter taught by the Khare et al. published application is that the gate dielectric thickness and nitrogen concentration is the same for both NFET and PFET device regions, and thus it is not optimal for one of the two devices.

FIG. 10 shows the device of FIG. 6D in accordance with this invention after formation of gate electrode 40 over the NFET gate dielectric layer 18D of the NFET area 14 and gate electrode 42 over the PFET gate dielectric layer 18E over the PFET area 16 followed by formation of self-aligned source S and drain D regions in each of the NFET area 14 and PFET area 16 of the device 10. The gate dielectric thickness is substantially the same in both regions, but the nitrogen concentration is different between the NFET and the PFET, as contrasted with the Trivedi devices in U.S. Pat. No. 6,541,395 where the physical thicknesses are different.

FIG. 11 shows a table that summarizes the tradeoffs in optimizing the NFET and PFET devices that together form the CMOS integrated circuit. The nitrogen concentration columns are sample areal nitrogen concentrations that illustrate the combinations of designing the NFET and PFET gate dielectric, and the impact on gate leakage, and mobility of the NFET and PFET. The gate leakage is a significant portion of the power dissipation in the integrated circuit. The combination of the mobility for the NFET and the PFET represent a metric that can be used to gauge the overall CMOS integrated circuit performance. While the gate leakage is important, the overriding parameter to optimize is the last column, which is the overall CMOS circuit performance that is largely determined by the combination of NFET and PFET mobilities.

Row A is a pure $SiO_2$ gate dielectric for both NFET and PFET. Because there is no nitrogen, the gate leakage is unacceptably high (−). Pure $SiO_2$ has been used as a gate dielectric since the beginning of CMOS technology hence it is treated as a reference standard (o).

Rows B and C represent different levels of nitrogen concentration achieved by prior art techniques. The NFET and PFET gate dielectric nitrogen concentrations are the same, since both are generated at the same time. Increasing the nitrogen concentration on both NFET and PFET devices from row B to C does reduce the gate leakage, but has the penalty of degrading the NFET mobility.

Row D represents the device configuration achieved by employing this invention. By separately nitriding the NFET and PFET gate dielectric as described here, it is possible to optimize the mobility of both devices independently, and achieve the highest possible overall CMOS device performance, shown by the + for the last column in row D. This is not achieved by the prior art in rows B and C.

While this invention has been described in terms of the above specific embodiment(s), those skilled in the art will recognize that the invention can be practiced with modificawithin the spirit and scope of the appended claims, i.e. that changes can be made in form and detail, without departing from the spirit and scope of the invention. For example, higher temperature thermal nitridation with an appropriate selection of a hard mask can be used in place of a low temperature plasma nitridation and photoresist soft mask described above as the preferred mode of operation. Accordingly all such changes come within the purview of the present invention and the invention encompasses the subject matter of the claims which follow.

What is claimed is:

1. A method of forming a CMOS semiconductor device with a PFET area and an NFET area formed on a semiconductor substrate, said PFET area being covered with a PFET gate dielectric layer and said NFET area covered with an NFET gate dielectric layer composed if silicon oxide with different degrees of nitridation thereof, providing a silicon substrate with a PFET area and an NFET area, forming a PFET gate oxide layers over said PFET area and an NFET gate oxide layer over said NFET area, providing nitridation of said PFET gate oxide layers over said PFET area and an NFET gate oxide layer over said NFET area, providing nitridation of said PFET gate oxide layer above said PFET area to form said PFET gate dielectric layer above said PFET area with a first optimized concentration level of nitrogen atoms in said PFET gate dielectric layer above said PFET area, providing nitridation of said NFET gate oxide layer to form said NFET gate dielectric layer above said NFET area with a second optimized concentration level of nitrogen atoms in said NFET gate dielectric layer above said NFET area, whereby an NFET concentration level of nitrogen atoms in said NFET gate dielectric layer is different from a PFET concentration level of nitrogen atoms in said PFET gate dielectric layer.

2. The method of claim 1 including performing the following steps with one thereof preceding the other:

forming an NFET mask over said NFET area prior to beginning nitridation of said PFET gate oxide layer, then performing PFET gate dielectric nitridation thereof, and immediately thereafter removing said NFET mask, and forming a PFET mask over said PFET area prior to beginning nitridation of said NFET gate oxide layer, then performing NFET gate dielectric nitridation thereof, and immediately thereafter removing said PFET mask.

3. The method of claim 2 including providing greater nitridation in said PFET gate dielectric layer above said PFET area than nitridation in said NFET gate dielectric layer above said NFET area.

4. The method of claim 3 wherein the nitridation process is performed at a temperature below the maximum temperature that the masking material can withstand.

5. The method of claim 2 wherein the nitridation process is performed at a temperature below the maximum temperature that the masking material can withstand.

6. The method of claim 1 including performing the following steps with one thereof preceding the other:

forming a single mask over one of said NFET area and said PFET area prior to beginning nitridation leaving the other one of said NFET area and said PFET area as an unmasked area, performing gate dielectric nitridation of said unmasked area, and immediately thereafter removing said single mask, and performing gate dielectric nitridation into both said NFET area and said PFET area adding an additional concentration of nitrogen to said NFET gate oxide layer and said PFET gate oxide layer.

7. The method of claim 6 including providing greater nitridation in said PFET gate dielectric layer above said PFET area than nitridation in said NFET gate dielectric layer above said NFET area.

8. The method of claim 7 wherein the nitridation process is performed at a temperature below the maximum temperature that the masking material can withstand.

9. The method of claim 6 wherein the nitridation process is performed at a temperature below the maximum temperature that the masking material can withstand.

10. The method of claim 1 including providing greater nitridation in said PFET gate dielectric layer above said PFET area than nitridation in said NFET gate dielectric layer above said NFET area.

11. The method of claim 10 wherein the nitridation process is performed at a temperature below the melting maximum temperature that the masking material can withstand.

12. The method of claim 1 wherein the nitridation process is performed at a temperature below the maximum temperature that the masking material can withstand.

13. The method of claim 1 including performing the following steps:

first forming a base oxide mask over a base oxide layer for a capacitor area in said substrate, then performing nitridation of a said gate dielectric layer followed by forming a mask thereover after removing said base oxide mask over said capacitor area, and then performing nitridation of said base oxide layer above said capacitor area thereby converting said base oxide layer into a capacitor dielectric layer.

14. A method of forming a CMOS semiconductor device with a PFET area and an NFET area formed on a semiconductor substrate, said PFET area being covered with a PFET gate dielectric layer and said NFET area covered with an NFET gate dielectric layer composed of silicon oxide and different degrees of nitridation thereof, providing a silicon substrate with a PFET area and an NFET area, forming a PFET gate oxide layer over said PFET area and an NFET gate oxide layer over said NFET area, forming an NFET mask over said NFET area prior to beginning nitridation of said PFET gate oxide layer, then performing PFET gate dielectric nitridation of said PFET gate oxide layer above said PFET area to form said PFET gate dielectric layer above said PFET area with a first optimized concentration level of nitrogen atoms in said PFET gate dielectric layer above said PFET area and then removing said NFET mask, forming a PFET mask over said PFET area prior to beginning nitridation of said NFET gate oxide layer, then performing NFET gate dielectric nitridation of said NFET gate oxide layer to form said NFET gate dielectric layer above said NFET area producing a second optimized concentration level of nitrogen atoms in said NFET gate dielectric layer above said NFET area, and then removing said PFET mask, whereby an NFET concentration level of nitrogen atoms in said NFET gate dielectric layer is less than said first concentration level of nitrogen atoms in said PFET gate dielectric layer, and said NFET gate dielectric layer and said PFET gate dielectric layer have substantially the same thickness.

15. The method of claim 14 including performing the following steps with one thereof preceding the other:

forming a single mask over one of said NFET area and said PFET area prior to beginning nitridation leaving the other one of said NFET area and said PFET area as an unmasked area, performing gate dielectric nitridation of said unmasked area, and immediately thereafter removing said single mask, and performing gate dielectric nitridation into both said NFET area and said PFET area adding an additional concentration of nitrogen to said NFET gate oxide layer and said PFET gate oxide layer, with a resulting total nitrogen content higher in said PFET gate oxide layer.

16. The method of claim 14 including providing greater nitridation in said PFET gate dielectric layer above said PFET area than nitridation in said NFET gate dielectric layer above said NFET area.

17. The method of claim 14 including performing the following steps:

first forming a base oxide mask over a base oxide layer for a capacitor area in said substrate, then performing nitridation of a said gate dielectric layer followed by forming a mask thereover after removing said base oxide mask over said capacitor area, and then performing nitridation of said base oxide layer above said capacitor area thereby converting said base oxide layer into a capacitor dielectric layer.

18. A CMOS semiconductor device with a PFET area and an NFET area formed on a semiconductor substrate, said PFET area being covered with a PFET gate dielectric layer and said NFET area covered with an NFET gate dielectric layer composed of silicon oxide and different degrees of nitridation thereof comprising:

a silicon substrate with said PFET area and said NFET area, a PFET gate dielectric layer over said PFET area and an NFET gate dielectric layer over said NFET area, said PFET gate dielectric layer above said PFET area being nitrided with a first optimized concentration level of nitrogen atoms in said PFET gate dielectric layer above said PFET area, said NFET gate dielectric layer above said NFET area being nitrided with a second optimized concentration level of nitrogen atoms in said NFET gate dielectric layer above said NFET area, said PFET gate dielectric layer and said NFET gate dielectric layer having different optimized levels of nitridation whereby a PFET concentration level of nitrogen atoms in said PFET gate dielectric layer above said PFET area is different from an NFET concentration level of nitrogen atoms in said NFET gate dielectric layer.

* * * * *